(12) United States Patent
Roizin et al.

(10) Patent No.: US 11,644,580 B2
(45) Date of Patent: May 9, 2023

(54) HIGH RESOLUTION RADIATION SENSOR BASED ON SINGLE POLYSILICON FLOATING GATE ARRAY

(71) Applicant: Tower Semiconductor Ltd., Migdal Haemek (IL)

(72) Inventors: Yakov Roizin, Afula (IL); Evgeny Pikhay, Migdal Haemek (IL); Vladislav Dayan, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 17/721,012

(22) Filed: Apr. 14, 2022

(65) Prior Publication Data

US 2022/0244410 A1  Aug. 4, 2022

Related U.S. Application Data

(62) Division of application No. 16/861,652, filed on Apr. 29, 2020, now Pat. No. 11,353,597.

(51) Int. Cl.
  *G01T 1/02* (2006.01)
  *H01L 27/146* (2006.01)
  (Continued)

(52) U.S. Cl.
  CPC ........ *G01T 1/026* (2013.01); *H01L 27/14623* (2013.01); *H01L 27/14659* (2013.01); *H01L 31/02164* (2013.01); *H01L 31/119* (2013.01)

(58) Field of Classification Search
  CPC ............... G01T 1/026; H01L 27/14623; H01L 27/14659; H01L 31/02164; H01L 31/119; H01L 27/14612; H01L 27/14625
  See application file for complete search history.

(56) References Cited

U.S. PATENT DOCUMENTS

| 4,678,916 A | 7/1987 | Thomson |
| 5,739,541 A | 4/1998 | Kahilainen |

(Continued)

OTHER PUBLICATIONS

Bloom, I. and Nemirovsky, Y., article entitled "1/ f noise reduction of metal-oxide-semiconductor transistors by cycling from inversion to accumulation", Appl. Phys. Lett., vol. 58, No. 15, pp. 1664-1666, Apr. 1991.

(Continued)

*Primary Examiner* — Kiho Kim
(74) *Attorney, Agent, or Firm* — Bever, Hoffman & Harms, LLP

(57) ABSTRACT

A method for radiation dosage measurement includes: (1) exposing a plurality of single-poly floating gate sensor cells to radiation; (2) measuring threshold voltage differences between logical pairs of the exposed sensor cells using differential read operations, wherein the sensor cells of each logical pair are separated by a distance large enough that radiation impinging on one of the sensor cells does not influence the other sensor cell; (3) determining whether each logical pair of exposed sensor cells is influenced by exposure to the radiation in response to the corresponding measured threshold voltage difference; and (4) determining a dosage of the radiation in response to the number of logical pairs of the exposed sensor cells determined to be influenced by exposure to the radiation. A non-radiation influenced threshold voltage shift may be measured and used in determining whether each logical pair of exposed sensor cells is influenced by radiation exposure.

20 Claims, 15 Drawing Sheets

(51) Int. Cl.
 *H01L 31/119* (2006.01)
 *H01L 31/0216* (2014.01)

(56) References Cited

U.S. PATENT DOCUMENTS

| | | |
|---|---|---|
| 6,172,368 B1 * | 1/2001 | Tarr .................. G01T 1/026 |
| | | 250/370.07 |
| 7,855,101 B2 | 12/2010 | Furman et al. |
| 8,519,345 B2 | 8/2013 | Arsalan et al. |
| 8,791,418 B2 | 7/2014 | Visconti et al. |
| 9,429,661 B2 | 8/2016 | Valentino et al. |
| 9,564,414 B2 | 2/2017 | Enquist et al. |
| 9,812,350 B2 | 11/2017 | Costa |
| 9,954,058 B1 | 4/2018 | Mochizuki et al. |
| 10,008,455 B2 | 6/2018 | Mason et al. |
| 2006/0027756 A1 | 2/2006 | Thomson et al. |
| 2010/0096556 A1 * | 4/2010 | Arsalan ............ H01L 27/14659 |
| | | 257/E27.122 |

OTHER PUBLICATIONS

Esfhen, B. Kazemi et al., article entitled "A SPDT RF Switch Small-and-Large-signal Characteristics on TR-HR SOI Substrates", Journal of Electron Device Society, 2018, 8 pages.

* cited by examiner

HIGH RESOLUTION RADIATION SENSOR BASED ON SINGLE POLYSILICON FLOATING GATE ARRAY

RELATED APPLICATIONS

This application is a divisional of U.S. patent application entitled "HIGH RESOLUTION RADIATION SENSOR BASED ON SINGLE POLYSILICON FLOATING GATE ARRAY", U.S. application Ser. No. 16/861,652, filed Apr. 29, 2020.

FIELD OF THE INVENTION

The present invention relates to a high-resolution radiation sensor array that implements low-capacitance floating gate cells having a single polysilicon layer. The present invention further relates to methods for operating the radiation sensor array to enable sensing of both low dose and high dose radiation exposure, wherein the methods provide compensation for natural retention loss and temperature effects.

RELATED ART

Passive solid state dosimeters often use floating gates. The floating gates are electrically isolated and charged before taking measurements. A dosimeter may have a gas filled chamber located over a floating gate device as described in U.S. Pat. No. 5,739,541 to Kahilainen, or over a non-volatile memory (NVM) cell as described in U.S. Pat. No. 6,172,368 to Tarr et al. (hereinafter, "the Tarr '368 Patent"). To define the threshold voltage (Vt) change in a floating gate based sensor due to radiation absorption, comparison of the sensor drain current with a reference device current is needed. In the Tarr '368 Patent, this comparison was performed using a pair of matched double polysilicon floating gate transistors, wherein: (1) different voltages are applied to the control gates of these transistors, or (2) the floating gates of these transistors are charged to opposite polarities. The pair of floating gate transistors is then exposed to the same radiation, and a difference in drain currents through these transistors is then measured. However, charge loss from the floating gates of these transistors can occur for other reasons than ionizing radiation, specifically, by thermal excitation (which is typical for all floating gate devices) or by the presence of ions in surrounding oxides. The construction of the floating gate transistors and the above-described method of operation do not allow for compensation of this charge loss. Moreover, floating gate transistors having their floating gates charged to significantly different potentials will exhibit different natural retention losses. As a result, the type of floating gate dosimeter described by the Tarr '368 patent has significant limitations.

U.S. Pat. No. 8,519,345 to Arsalan et al. describes a sensor that includes a single polysilicon floating gate sensor device and a single polysilicon floating gate reference device, which have very different layouts, geometries and sizes. The single polysilicon floating gate reference device is not sensitive to radiation (due to the lack of an extension of the floating gate over an adjacent field dielectric). The reference device serves to compensate for environmental influences (e.g., temperature) on the sensor DC current. As for the retention performance, significantly different layouts in the sensor device and the reference device lead to different retention performance. Thus, in long term measurements (especially for low radiation dose rates), matching of the reference device and the sensor device becomes incorrect.

In U.S. Pat. No. 8,791,418 to Visconti et al., a two dimensional array of memory cells is used to implement a spatial dosimeter. The change in the threshold voltage of each of the cells, as a result of large dose radiation exposure, may be used to calculate the dose seen at each cell, allowing dose profiles in two dimensions with sub-micrometer resolution. However, this radiation sensor will only work with exposure to large radiation doses.

U.S. Pat. No. 9,429,661 to Valentino et al. describes techniques to encapsulate individual ionizing radiation sensor elements mounted on a printed circuit board with a radiation attenuating material that provides a 'filtration bubble' around the sensor element.

None of the above-mentioned references address the issues associated with measuring very low radiation doses with floating gate sensor arrays. When radiation doses at a level of 1 milli-rad (mrad) and below are considered, the number of Gamma photons or Alpha particles impinging on the sensor area is much smaller than the number of cells/pixels of the sensor. For example, for a 1 mrad dose, only about two 1 MeV photons are present for a sensor area of 1 $mm^2$. The structures and methods described in the above-mentioned references are incapable of measuring such low radiation doses.

It would therefore be desirable to have an improved radiation sensor that is capable of measuring both very low radiation doses and high radiation doses. It would further be desirable for such an improved radiation sensor to be fabricated in accordance with a conventional CMOS process that includes a single polysilicon layer. It would further be desirable for such an improved radiation sensor to be able to distinguish between radiation having different energies. It would further be desirable for such an improved radiation sensor to be able to compensate for non-radiation based leakage factors such as temperature and natural retention loss of charge from the floating gate. It would further be desirable to have low-capacitance floating gate transistor structures for use in the improved radiation sensor.

SUMMARY

Accordingly, the present invention provides a method for measuring radiation dosage that includes exposing a plurality of single-poly floating gate sensor cells to radiation. The sensor cells are logically grouped into a plurality of pairs, wherein the two sensor cells of each logical pair are separated by a physical distance, such that a single energetic particle/photon that impinges on one of the sensor cells of the logical pair does not influence the other sensor cell of the logical pair.

After radiation exposure, a plurality of differential read operations are performed, wherein each differential read operation accesses a corresponding logical pair of the exposed sensor cells, thereby identifying a threshold voltage difference between the logical pair of the exposed sensor cells. The identified threshold voltage differences are used to determine whether each logical pair of exposed sensor cells has been influenced by exposure to the radiation. For example, if a single energetic particle/photon impinges on only one sensor cell of a logical pair, and such an impingement would result in a known threshold voltage difference between the sensor cells of the logical pair, then a logical pair of exposed sensor cells that has an identified threshold voltage difference that corresponds with this known threshold voltage difference may be identified as an influenced logical pair of sensor cells. For low dosage radiation exposure (e.g., 50% or fewer of the sensor cells receives an impinging energetic particle/photon) the dosage of the radiation is determined based on the number of identified influenced logical pairs of sensor cells.

In accordance with one embodiment, the initial threshold voltage (after initialization and prior to radiation exposure) of each of the plurality of sensor cells is determined. For example, the threshold voltage of each of the sensor cells may be determined by performing a differential read operation with a radiation-insensitive reference cell. The initial threshold voltage of each sensor cell is used to calculate an average initial threshold voltage of all of the sensor cells. The post-exposure threshold voltage of each of the sensor cells is also determined (e.g., by performing a differential read operation with a radiation-insensitive reference cell). The post-exposure threshold voltage of each sensor cell is used to calculate an average post-exposure threshold voltage of all of the sensor cells. An average threshold voltage shift is determined by calculating the difference between the average initial threshold voltage and the average post-exposure threshold voltage.

In one embodiment, the average threshold voltage shift is used to determine whether each logical pair of the exposed sensor cells is influenced by exposure to radiation. For example, a logical pair of exposed sensor cells is only determined to be influenced by exposure to radiation if these exposed sensor cells: (1) exhibit the determined average threshold voltage shift, and (2) exhibit the above-described known threshold voltage difference.

In accordance with another embodiment, the each of the plurality of sensor cells includes a read transistor that is coupled to the corresponding floating gate. In this embodiment, each differential read operation includes coupling the read transistors of the logical pair of sensor cells to a constant current source (that comprises an integral part of a common sense amplifier) and biasing the control gates of the sensor cells such that the same current flows through both sensor cells, wherein the voltage difference between control gates of the sensor cells is read out as a threshold voltage difference.

In accordance with another embodiment, the charges stored by the floating gates of the sensor cells are initialized (by a program or erase operation) prior to exposing sensor cells to radiation, such that the dielectric interface traps of these sensor cells are all filled (or all empty) before each read operation. This advantageously ensures the suppression of 1/f noise in the read transistors of the sensor cells for low dose radiation measurements (because this initial state does not significantly change in response to low dose radiation exposure, so that traps remain in the empty/filled state after irradiation because the threshold voltage shift (i.e., the change in the charge stored by the floating gate) is small.

In accordance with another embodiment, the number of logical pairs of exposed sensor cells determined to be influenced by exposure to the radiation is compared with a threshold number (e.g., half of the total number of sensor cells). If the number of influenced logical pairs of sensor cells is less than the threshold number, then the exposure is identified as a low dose exposure, and the dose is calculated based on the number of influenced logical pairs of sensor cells. However, if the number of influenced logical pairs is greater than or equal to the threshold number, then the exposure is identified as a high dose exposure, and the dose is calculated based on the difference between the average initial threshold voltage of the sensor cells and the average post-exposure threshold voltage of the sensor cells.

In accordance with yet another embodiment, the plurality of sensor cells are arranged in an array that includes a first sub-array and a second sub-array, where each logical pair of sensor cells includes a first sensor cell in the first sub-array, and a second sensor cell in the second sub-array. The first and second sensor cells can be located in the same row of the array, or in different rows of the array.

In accordance with another embodiment of the present invention, an improved radiation sensor includes a first array of sensor cells and a second array of sensor cells, wherein each of the sensor cells in the first array and each of the sensor cells in the second array includes a radiation sensitive capacitance structure and a read transistor coupled to a corresponding floating gate. Each of the sensor cells in the first array is logically paired with a corresponding one of the sensor cells in the second array, wherein the logically paired sensor cells are spatially separated by a distance exceeding a correlation length of radiation being sensed. A multiplexer circuit selectively couples read transistors of logically paired sensor cells of the first and second arrays in differential pairs to compare the threshold voltages of the read transistors. In one embodiment, the first array is identical to the second array.

In one embodiment, each of the differential pairs is coupled to a corresponding constant current source and a corresponding sense amplifier in order to compare the threshold voltages of the read transistors.

In accordance with another embodiment, the radiation sensitive capacitance structure of each sensor cell is designed to have a relatively small capacitance. Various structures can be used to achieve this small capacitance. In one embodiment, the floating gate of the sensor cell includes a plurality of polysilicon fingers in the radiation sensitive capacitance region. In another embodiment, each sensor cell includes an air gap located adjacent to the radiation sensitive capacitance structure. The air gap can be formed from either the front side or the back side of the radiation sensor. In one embodiment, the air gap is located at the back side of the radiation sensor structure, and the air gap is sealed by a passivation layer or a bonded wafer. In another embodiment, the air gap is located in a multi-layer dielectric structure located over the floating gate of the sensor cell, at the front side of the radiation sensor structure.

In accordance with another embodiment, the radiation sensor includes a multi-layer interconnect structure that includes a plurality of metal layers and a plurality of dielectric layers. Radiation filters are formed over the radiation sensitive capacitance structures of the sensor cells, wherein the radiation filters are formed using the multi-layer interconnect structure. In one embodiment, the radiation filters include traces from one or more of the metal layers of the multi-layer interconnect structure, and may comprise aluminum, copper and/or tungsten. In another embodiment, the radiation filters include one or more of the dielectric layers of the multi-layer interconnect structure. These radiation filters advantageously allow the radiation sensor to be able to distinguish between radiation having different energies.

The present invention will be more fully understood in view of the following description and drawings.

DETAILED DESCRIPTION

In general, the present invention includes an ultra-sensitive radiation sensor and methods of operating the same. The radiation sensor does not need a voltage supply in the registration (sensing) mode. In one embodiment, the radiation sensor consists of an array of single poly floating gate (FG) sensor cells with integrated-in-silicon low-capacitance ionization chambers. To achieve high resolution of radiation measurements (Gamma/X-ray radiation and energetic ions), the array of sensor cells is divided into two parts. Each of the FG sensor cells has a corresponding FG sensor cell programmed to a similar threshold voltage, thereby forming logical pairs of programmed FG sensor cells. Any difference in gate charges (manifested as changes in threshold voltages) in the logical pairs of programmed FG sensor cells is registered using a differential read operation. The number of logical pairs of programmed FG sensor cells exhibiting a difference in gate charge (i.e., the number of influenced pairs of FG sensor cells) is an indication of the absorbed radiation dose for low doses. The averaged FG charge decrease of all the FG sensor cells is an indication of the absorbed radiation dose at high doses. To account for influences not connected with radiation in the low-dose measurement (temperature, natural retention loss of charge from FG), the threshold voltage (Vt) change of each FG sensor cell in the array is compared with the average threshold voltage change for all FG sensor cells in the array. The FG sensor cells with outlying threshold voltage changes are eliminated from consideration in the low-dose calculation. The present invention will now be described in more detail.

Figure 1:
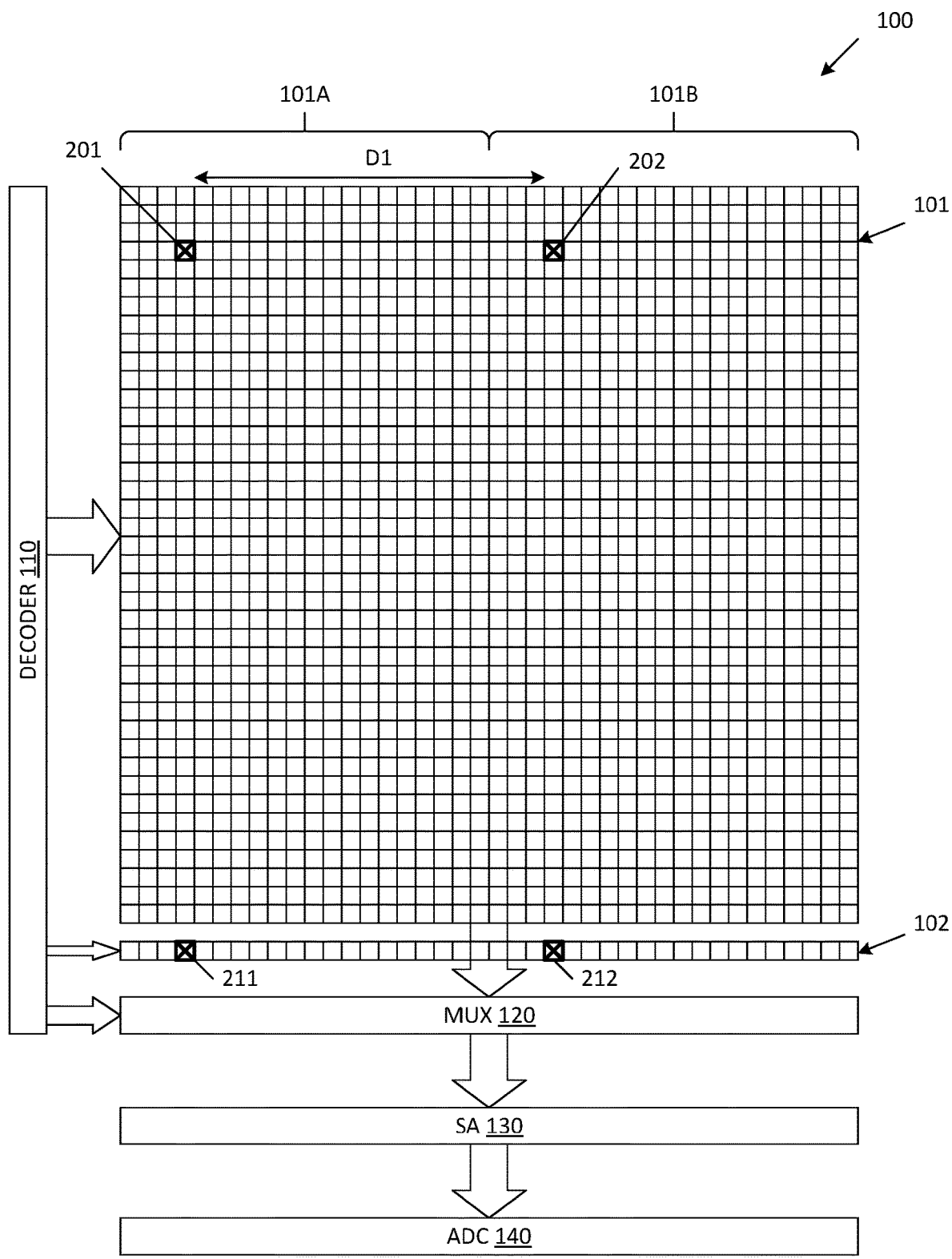
FIG. 1 is a block diagram of a radiation sensor in accordance with one embodiment of the present invention.

FIG. 1 is a block diagram of a radiation sensor 100 in accordance with one embodiment of the present invention. Radiation sensor 100 includes sensor cell array 101 that includes a plurality of single-poly floating gate CMOS sensor (C-sensor) cells arranged in rows and columns. In general, the threshold voltages of the C-sensor cells will change in response to exposure to radiation (i.e., the C-sensor cells are radiation sensitive). As described in more detail below, the sensor cell array 101 is logically divided into two sub-arrays 101A-101B for performing low dose radiation measurements. Exemplary C-sensor cells 201 and 202 are located in sub-arrays 101A and 101B, respectively. Decoder 110 controls access to the C-sensor cells of sensor cell array 101 in the manner described below, including program, erase and read operations.

Radiation sensor 100 also includes reference cells 102, including exemplary CMOS reference cells 211 and 212. In general, the threshold voltages of reference cells 102 will not change in response to exposure to radiation (i.e., the reference cells are radiation insensitive). In one embodiment, reference cells 211 and 212 are non-programmed cells of same type as C-Sensor cells 201 and 202. In another embodiment, reference cells 211 and 212 are C-Sensor cells with floating gates $FG_{F1}$ and $FG_{F2}$ shorted to control gates $CG_{F1}$ and $CG_{F2}$, respectively (as illustrated by dashed lines in FIG. 2).

In other embodiments, reference cells 211 and 212 are implemented by single-poly floating gate CMOS flash (C-Flash) transistors. In yet other embodiments, the reference cells 102 can be implemented by resistors or MOS transistors. In the illustrated example, reference cells 211 and 212 are aligned in the same 'columns' as C-sensor cells 201 and 202, respectively. Decoder 110 controls access to the reference cells 102 in the manner described below.

Although reference cells 102 are shown as a single row of cells in the illustrated embodiment, it is understood that reference cells 102 can be implemented as an array of cells in an alternate embodiment (wherein each of the C-sensor cells in array 101 has a corresponding reference cell in the array of reference cells). This array of reference cells can be physically separated from sensor cell array 101.

Alternately, this array of reference cells can be interspersed within the sensor cell array 101. For example, reference cells 211 and 212 can be located immediately adjacent to corresponding C-sensor cells 201 and 202, respectively, within the sensor cell array 101.

Decoder 110 also controls multiplexer circuit 120 to selectively couple the C-sensor cell array 101 and reference cells 102 to sense amplifiers 130 during read operations in a manner described in more detail below. Sense amplifiers 130 are coupled to provide analog read signals to analog-to-digital converters (ADCs) 140.

Figure 2:
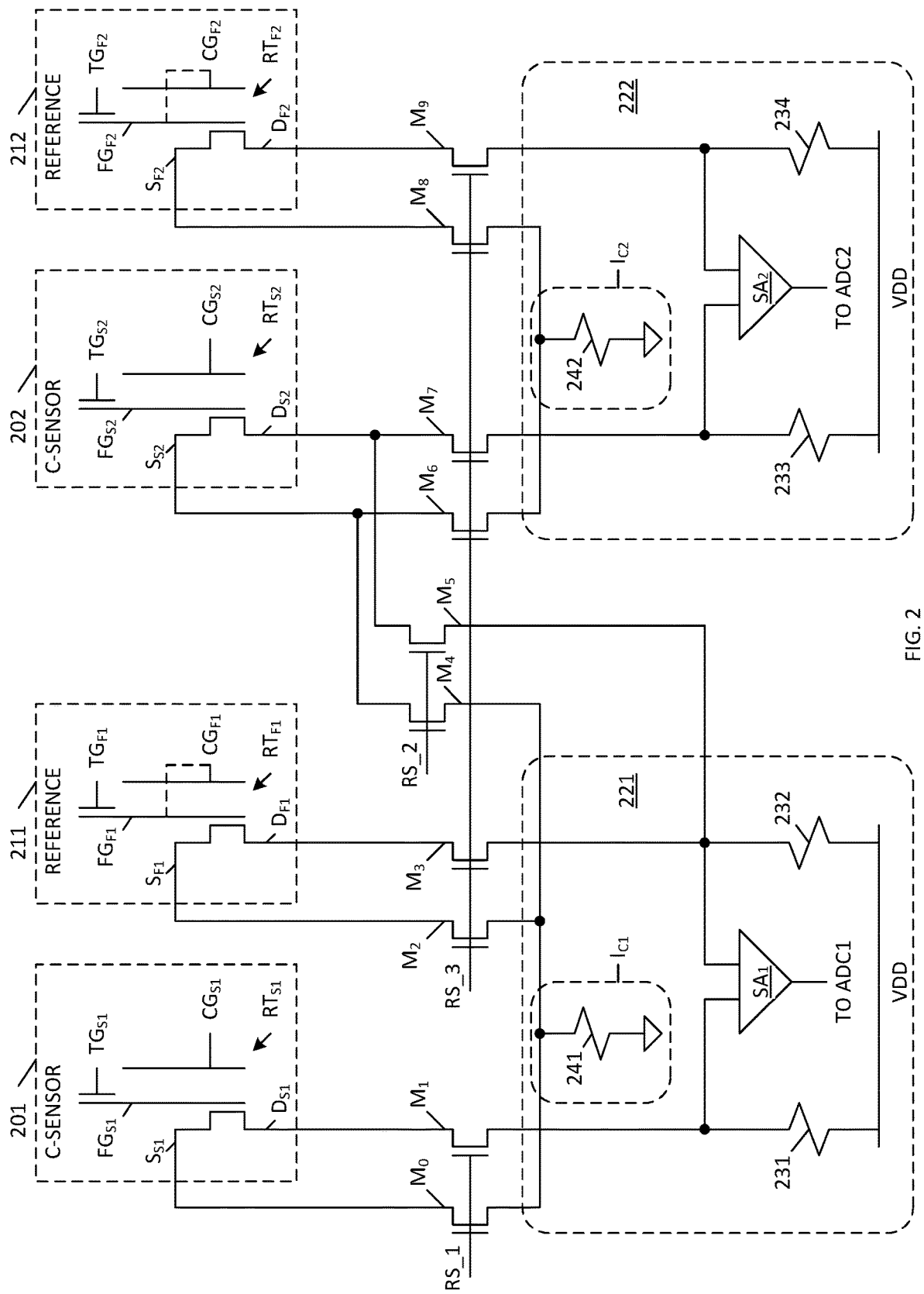
FIG. 2 is a circuit diagram illustrating C-Sensor cells and C-Reference cells, along with corresponding portions of a multiplexer circuit and sense amplifiers, in accordance with one embodiment of the present invention.

FIG. 2 is a circuit diagram illustrating C-Sensor cells 201-202 and reference cells 211-212, along with corresponding portions of multiplexer circuit 120 and sense amplifiers 130, in accordance with one embodiment of the present invention. C-sensor cells 201 and 202 are single-poly floating gate sensor devices, which include floating gates $FG_{S1}$ and $FG_{S2}$, respectively, tunnel gates $TG_{S1}$ and $TG_{S2}$, respectively, control gates $CG_{S1}$ and $CG_{S2}$, respectively, and read transistors $RT_{S1}$ and $RT_{S2}$, respectively (which include source regions $S_{S1}$ and $S_{S2}$, respectively, and drain regions $D_{S1}$ and $D_{S2}$, respectively). Various low-capacitance constructions for C-sensor cells 201 and 202 are described in more detail below. In general, the floating gates $FG_{S1}$ and $FG_{S2}$ are initially programmed (charged), such that the C-sensor cells 201 and 202 exhibit an initial threshold voltage (Vt). If exposed to radiation, the charges stored by the floating gates $FG_{S1}$ and $FG_{S2}$ are reduced, thereby reducing the threshold voltages of the C-sensor cells 201 and 202.

Reference cells 211 and 212 are also single-poly floating gate devices, identical to the C-sensor cells 201 and 202, which include floating gates $FG_{F1}$ and $FG_{F2}$, respectively, tunnel gates $TG_{S1}$ and $TG_{S2}$, respectively, control gates $CG_{F1}$ and $CG_{F2}$, respectively, and read transistors $RT_{F1}$ and $RT_{F2}$, respectively (which include source regions $S_{F1}$ and $S_{F2}$, respectively, and drain regions $D_{F1}$ and $D_{F2}$, respectively). In low dose measurements (described in more detail below), when a number of influenced pairs of C-sensor cells are calculated, identical C-sensor cells are programmed to the same threshold voltage to ensure identical dependence on temperature and account for natural threshold voltage (Vt) decrease. In high dose measurements (described in more detail below), the use of identical C-sensor cells and reference cells also provide an advantage of the same temperature response. As described above, C-sensor cells and reference cells can have the same design and layout, but the reference cells are not programmed. Alternately, the C-sensor cells and reference cells can have the same design and layout, but the control gates are connected to the floating gates in the reference cells.

C-sensor cells 201-202 and reference cells 211-212 are coupled to multiplexer transistors $M_0$-$M_9$ of multiplexer circuit 120. More specifically, the source $S_{S1}$ and drain $D_{S1}$ of C-sensor cell 201 are coupled to multiplexer transistors $M_0$ and $M_1$, respectively; the source $S_{F1}$ and drain $D_{F1}$ of reference cell 211 are coupled to multiplexer transistors $M_2$ and $M_3$, respectively; the source $S_{S2}$ and drain $D_{S2}$ of C-sensor cell 202 are coupled to multiplexer transistors $M_4$ and $M_5$, respectively, and also to multiplexer transistors $M_6$ and $M_7$, respectively; and the source $S_{F2}$ and drain $D_{F2}$ of reference cell 212 are coupled to multiplexer transistors $M_8$ and $M_9$, respectively.

Multiplexer transistors $M_0$-$M_9$ couple C-sensor cells 201-202 and reference cells 211-212 to sense amplifier circuits 221 and 222, as illustrated. More specifically, sense amplifier circuit 221 includes a constant current source $I_{C1}$, which is coupled to multiplexer transistors $M_0$, $M_2$ and $M_4$, a sense amplifier $SA_1$, which has one input terminal coupled to multiplexer transistor $M_1$ and another input terminal coupled to multiplexer transistors $M_3$ and $M_5$, a first drain resistor 231 coupled between multiplexer transistor $M_1$ and the VDD voltage supply terminal, and a second drain resistor 232 coupled between multiplexer transistors $M_3$ and $M_5$ and the VDD voltage supply terminal. In the illustrated embodiment, constant current source $I_{C1}$ is implemented by a resistor 241 coupled to ground. The output of sense amplifier $SA_1$ is provided to an analog-to-digital converter (ADC1).

Similarly, sense amplifier circuit 222 includes constant current source $I_{C2}$, which is coupled to multiplexer transistors $M_6$ and $M_8$, sense amplifier $SA_2$, which has one input terminal coupled to multiplexer transistor $M_7$ and another input terminal coupled to multiplexer transistor $M_9$, a first drain resistor 233 coupled between multiplexer transistor $M_7$ and the VDD voltage supply terminal, and a second drain resistor 234 coupled between multiplexer transistor $M_9$ and the VDD voltage supply terminal. In the illustrated embodiment, constant current source $I_{C2}$ is implemented by a resistor 242 coupled to ground. The output of sense amplifier $SA_2$ is provided to an analog-to-digital converter (ADC2).

The logical pair of C-sensor cells 201 and 202 are selected such that the physical distance (D1) between these cells within array 101 is large enough that an energetic particle or photon that has an effect on one of these cells does not have an effect on the other one of these cells. That is, an energetic particle or photon that impinges on the C-sensor cell 201 (and changes the threshold voltage of this C-sensor cell 201) does not have any effect on the threshold voltage of the corresponding C-sensor cell 202 of the logical pair. Stated another way, the distance D1 is greater than a correlation length of the energetic particle/photon of the radiation. Each of the C-sensor cells of sensor array 101 is logically paired with a corresponding C-sensor cell of array 101, wherein each logical pair of C-sensor cells is separated by a distance of at least D1.

In an alternate embodiment, the physical distance D1 between logical pairs of C-sensor cells is varied (using the multiplexer circuit 120) to define the correlation length for different impinging particles. For example, for a first type of impinging particle, the distance D1 between the C-sensor cells of a logical pair can be incrementally increased over successive exposures, until an impinging particle only influences one of the C-sensor cells of the logical pair. The distance D1 under these conditions defines the correlation length of the first type of impinging particle.

In a particular embodiment, one of the C-sensor cells of a logical pair is located in sub-array 101A, and the other one of the C-sensor cells of the logical pair is located in sub-array 101B.

In one embodiment, the area of array 101 is large enough, and the area of each C-sensor cell is small enough, to obtain statistically significant results for low dose exposure. In one embodiment, the area of array 101 is at least 10 mm² and the array 100 includes about 1 Mbit or fewer floating gate cells.

Although the logical pair of C-sensor cells 201 and 202 of the present example is shown in the same row of sensor cell array 101, it is understood that in other embodiments, paired C-sensor cells can be located in different rows of sensor array 101. In one such an embodiment, sub-arrays 101A and 101B have independent decoder circuits, enabling different rows of sub-arrays 101A and 101B to be simultaneously accessed.

The operation of radiation sensor 100, including paired C-sensor cells 201-202 and corresponding reference cells 211-212, will now be described. Sensor 100 is advantageously able to detect both low dose radiation and high dose radiation in the manner described below.

Initially, the C-sensor cells of C-sensor cell array 101 and reference cells 102 are programmed to a predetermined initial threshold voltage $VT_{INIT}$. For example, the initial programmed threshold voltage $VT_{INIT}$ may have a value in the range of about 2-4 Volts. In a particular example, the floating gate of each C-sensor cell of array 101 has an area of about 200 μm² over a shallow trench isolation (STI) layer having a thickness of about 3500 Angstroms, wherein the floating gate has a capacitance of about 20 femto-farads (fF), and is charged to an initial threshold voltage ($V_T$) of about 4V. Impingement of a single alpha particle or gamma photon in the radiation sensitive capacitance region of the cell results in a corresponding threshold voltage change on the order of approximately 1-2 mV.

Prior to exposure to radiation, the initial threshold voltage of each of the C-sensor cells in C-sensor cell array 101 is measured and recorded. This operation is performed by comparing the threshold voltage of each C-sensor cell with the threshold voltage of the corresponding reference cell. For example, the initial threshold voltages of C-sensor cells 201 and 202 are determined by performing comparisons with corresponding reference cells 211 and 212. In order to properly connect C-sensor cells 201-202 and reference cells 211-212, read select signals RS_1 and RS_3 are activated, thereby turning on multiplexer transistors $M_0$-$M_3$ and $M_6$-$M_9$. Under these conditions, C-sensor cell 201 and reference cell 211 are commonly coupled to sense amplifier circuit 221, and C-sensor cell 202 and reference cell 212 are commonly coupled to sense amplifier circuit 222.

In the embodiment of FIG. 2, threshold voltage comparisons can be performed by applying a fixed reference voltage to the control gates $CG_{F1}$ and $CG_{F2}$ of reference cells 211 and 212, and changing the voltages applied to the control gates $CG_{S1}$ and $CG_{S2}$ of C-sensor cells 201 and 202 until the moment when equal currents flow through the channels of the C-sensor cells 201-202 and the corresponding reference cells 211-212. In one embodiment, closed loops are used to apply the voltages to the control gates $CG_{S1}$ and $CG_{S2}$. More specifically, the outputs of sense amplifiers $SA_1$ and $SA_2$ are coupled to the control gates $CG_{S1}$ and $CG_{S2}$, respectively, thereby creating feedback loops that automatically adjust the voltages applied to the control gates $CG_{S1}$ and $CG_{S2}$, until equal currents flow through C-sensor cells 201 and 202 and the corresponding reference cells 211 and 212. Under these conditions, the final voltage provided by the sense amplifier $S_{A1}$ is representative of the initial threshold voltage difference ($\Delta VT1_{INIT}$) between C-sensor cell 201 and reference cell 211. Similarly, the final voltage provided by sense amplifier $SA_2$ is representative of the initial threshold voltage difference ($\Delta VT2_{INIT}$) between C-sensor cell 202 and reference cell 212.

The final voltages provided by sense amplifiers $SA_1$ and $SA_2$ are provided to ADC1 and ADC2, respectively, which convert these final voltages to digital threshold voltage values. This process is repeated for each row of C-sensor cell array 101.

In an alternate embodiment, open loops are used to apply the voltages to the control gates $CG_{S1}$ and $CG_{S2}$. In this embodiment, a first digital to analog converter (DAC) control circuit (not shown) is used to apply a first varying voltage to the control gate $CG_{S1}$, and a second DAC control circuit (not shown) is used to apply a second varying voltage to the control gate $CG_{S2}$. The first and second DAC control circuits are also coupled to the outputs of sense amplifiers $SA_1$ and $SA_2$, respectively, thereby enabling the first DAC control circuit to detect when equal currents flow through the C-sensor cell 201 and the reference cell 211, and enabling the second DAC control circuit to detect when equal currents flow through the C-sensor cell 202 and the reference cell 212 (e.g., equal currents are indicated when the outputs of the sense amplifiers $SA_1$ and $SA_2$ change states). When equal currents are detected in the C-sensor cell 201 and the reference cell 211, the corresponding voltage provided by the first DAC control circuit to the control gate $CG_{S1}$ of C-sensor cell 201 is representative of the initial threshold voltage difference ($\Delta VT1_{INIT}$) between C-sensor cell 201 and reference cell 211. Similarly, when equal currents are detected in the C-sensor cell 202 and the reference cell 212, the corresponding voltage provided by the second DAC control circuit to the control gate $CG_{S2}$ of C-sensor cell 202 is representative of the initial threshold voltage difference ($\Delta VT2_{INIT}$) between C-sensor cell 202 and reference cell 212.

In various embodiments, the voltages provided by the first and second DAC control circuits are varied by different selected algorithms, such as successive approximation or single slope.

The initial threshold voltages of the C-sensor cells of sensor array 101 will typically conform to a sharp Gaussian distribution, wherein most C-sensor cells exhibit an average initial threshold voltage of $VT_{AVG\_INIT}$.

Also prior to exposure to radiation, the initial threshold voltage differences between the logical pairs of C-sensor cells in sensor cell array 101 are measured and recorded. For example, the initial threshold voltage difference between C-sensor cells 201 and 202 is determined as follows. Read select signals RS_1 and RS_2 are activated, thereby turning on multiplexer transistors $M_0$-$M_1$ and $M_4$-$M_5$. Under these conditions, C-sensor cell 201 and C-sensor cell 202 are coupled to sense amplifier circuit 221. The control gates $CG_{S1}$ and $CG_{S2}$ of C-sensor cells 201 and 202 are biased such that equal currents flow through these C-sensor cells 201 and 202 (using either the closed loop method or the open loop method described above). The difference between the voltages applied to the control gates $CG_{S1}$ and $CG_{S2}$ under this equal current condition is measured, and is designated as the initial threshold voltage difference ($\Delta VT12_{INIT}$) between C-sensor cell 201 and C-sensor cell 202.

Note that it is desirable to decrease the total capacitance of the C-Sensor cells 201-202 to facilitate read (comparison) operations (i.e., to ensure that small changes in threshold voltages due to impingement of a single particle/photon can be detected). However, scaling down the size of read transistors $RT_{S1}$-$RT_{S2}$ is limited by the design rules of corresponding CMOS technology. During a read (Vt comparison) operation, voltage applied to the control gate terminal is divided between control gate to floating gate capacitance and the capacitance of the read transistor to ground. This voltage division limits the possible initial programming level (charge at the floating gate) of the C-Sensor cell, while the sensitivity of floating gate radiation sensors is known to depend on the programming level. To eliminate the major part of read transistors capacitances (Gate to Source) during a read (comparison) operation, equal constant currents are forced through read transistors of C-sensor and reference cells. This leads to a constant potential difference between each of the floating gates and the channels of the corresponding read transistors, thus effectively compensating the gate capacitance of these transistors. The remaining capacitance to ground is gate to drain capacitance which is much smaller than the gate to source capacitance. Technically, this is realized by the sense amplifier circuit 221 of FIG. 2, wherein read transistors $RT_{S1}$ and $RT_{S2}$ are joined into one differential pair biased by one tail current (provided by constant current source $I_{C1}$) to form the input stage to ADC1. In equilibrium conditions, the currents are equal in each of the read transistors $RT_{S1}$ and $RT_{S2}$ of the "logic pair", while the difference of voltages at the control gates $CG_{S1}$ and $CG_{S2}$ is recorded by sense amplifier $SA_1$ and ADC1.

After the above-described threshold voltage measurements are taken and recorded, radiation sensor 100 is exposed to radiation. Note that during the exposure, there are no external voltages applied to the C-sensor cells of sensor array 101 (or to the reference cells 102). That is, the C-sensor cells of sensor array 101 (and the reference cells 102) are used as passive sensitive elements when the sensor 100 is subjected to radiation.

After exposure, the threshold voltage differences between the logical pairs of C-sensor cells are measured and recorded again, in the manner described above. For example, C-sensor cell 201 and C-sensor cell 202 are biased in the manner described above and are coupled to sense amplifier circuit 221. In response, sense amplifier $SA_1$ provides an output to ADC1, which is representative of the post-exposure threshold voltage difference ($\Delta VT12_{EXPOSED}$) between C-sensor cell 201 and C-sensor cell 202.

The pre-exposure threshold voltage differences between the logical pairs of C-sensor cells are then compared with the post-exposure threshold voltage differences between the logical pairs of C-sensor cells. For example, the post-exposure threshold voltage difference between the logical pair of C-sensor cells 201-202 ($\Delta VT12_{EXPOSED}$) is subtracted from the pre-exposure threshold voltage difference between the logical pair of C-sensor cells 201-202 ($\Delta VT12_{INIT}$), thereby providing a change in the threshold voltage difference between this logical pair of C-sensor cells 201-202 ($\Delta VT12_{INIT}-\Delta VT12_{EXPOSED}$). Note that for a low dosage exposure (less than about 1 mrad), it is likely that neither of the logical pair of C-sensor cells 201-202 receives an alpha particle/gamma photon. In this case, the change in the threshold voltage difference ($\Delta VT12_{INIT}-\Delta VT12_{EXPOSED}$) should be 0 (because the threshold voltages of C-sensor cells are not changed by the exposure). However, if one of the C-sensor cells 201-202 receives a single alpha particle/gamma photon (e.g., from radon decomposition), and the other one of the C-sensor cells does not, then the change in the threshold voltage difference ($\Delta VT12_{INIT}-\Delta VT12_{EXPOSED}$) should be a small, known value (e.g., 1 mV) based on the known design characteristics of the C-sensor cells.

All logical pairs of C-sensor cells that exhibit a change in the threshold voltage difference corresponding with the known value (e.g., 1 mV), are categorized as potentially influenced C-sensor cell pairs for a low dosage measurement. However, to confirm whether the potentially influenced C-sensor cell pairs are actually influenced, other factors that could lead to a change in the threshold voltage difference must be considered. More specifically, changes in threshold voltages due to natural retention loss and changes in temperature must be considered. To accomplish this, the post-exposure threshold voltage of each of the C-sensor cells is measured and recorded, by comparing the threshold voltage of each C-sensor cell with the threshold voltage of the corresponding reference cell, in the manner described above. For example, the post-exposure threshold voltage difference ($\Delta VT1_{EXPOSED}$) between C-sensor cell 201 and reference cell 211, and the post-exposure threshold voltage difference ($\Delta VT2_{EXPOSED}$) between C-sensor cell 202 and reference cell 212 are determined in the manner described above.

The post-exposure threshold voltages of the C-sensor cells of sensor array 101 will typically conform to a sharp Gaussian distribution, wherein most C-sensor cells exhibit an average post-exposure threshold voltage of $VT_{AVG\_EXPOSED}$. The difference ($\Delta VT_{AVG}$) or 'shift' between the average initial threshold voltage $VT_{AVG\_INIT}$ and the average post-exposure threshold voltage of $VT_{AVG\_EXPOSED}$ is determined. This threshold voltage shift ($\Delta VT_{AVG}$) is used to determine whether the potentially influenced C-sensor cell pairs should be counted as actually influenced C-sensor cell pairs. For example, assume that the threshold voltage shift ($\Delta VT_{AVG}$) is 5 mV, wherein this average threshold voltage shift is due to an external factor, such as temperature. In this case, an actually influenced C-sensor cell pair is a C-sensor cell pair having a threshold voltage shift of 5 mV and a threshold voltage difference of 1 mV.

For example, assume that the initial (pre-exposure) threshold voltages of C-sensor cells 201 and 202 are both measured at 0 Volts with respect to reference cells 211 and 212 (i.e., $\Delta VT1_{INIT}=0$ Volts; $\Delta VT2_{INIT}=0$ Volts) and that the initial threshold voltage difference between C-sensor cells 201 and 202 is measured at 0 Volts (i.e., $\Delta VT12_{INIT}=0$ Volts). Further assume that the post-exposure threshold voltage difference between C-sensor cells 201 and 202 is measured at 1 mV ($\Delta VT12_{EXPOSED}=1$ mV), such that the logical pair of C-sensor cells 201 and 202 is identified as a potentially influenced C-sensor cell pair (i.e., $\Delta VT12_{INIT}-\Delta VT12_{EXPOSED}=1$ mV). Further assume that the threshold voltage shift $\Delta VT_{AVG}$ is determined to be 5 mV. In this case, the post-exposure threshold voltage difference ($\Delta VT1_{EXPOSED}$) between C-sensor cell 201 and reference cell 211, and the post-exposure threshold voltage difference ($\Delta VT2_{EXPOSED}$) between C-sensor cell 202 and reference cell 212 are analyzed to determine whether the potentially influenced C-sensor cell pair 201-202 are identified as an actually influenced C-sensor cell pair.

For example, if the post-exposure threshold voltage difference of C-sensor cell 201 ($\Delta VT1_{EXPOSED}$) is equal to 5 mV, and the post-exposure threshold voltage difference of C-sensor cell 202 ($\Delta VT2_{EXPOSED}$) is equal to 6 mV, then the C-sensor cell pair 201-202 corresponds with an actually influenced C-sensor cell pair, because these post-exposure threshold voltage differences correspond with the calculated threshold voltage shift $\Delta VT_{AVG}$ of 5 mV and the expected post-exposure threshold voltage difference of 1 mV.

However, if the post-exposure threshold voltage difference of C-sensor cell 201 ($\Delta VT1_{EXPOSED}$) is equal to 10 mV, and the post-exposure threshold voltage difference of C-sensor cell 202 ($\Delta VT2_{EXPOSED}$) is equal to 9 mV, then the C-sensor cell pair 201-202 does not correspond with an actually influenced C-sensor cell pair, because these post-exposure threshold voltage differences do not correspond with the calculated threshold voltage shift $\Delta VT_{AVG}$ of 5 mV.

If the post-exposure threshold voltage difference of C-sensor cell 201 ($\Delta VT1_{EXPOSED}$) is equal to 7 mV, and the post-exposure threshold voltage difference of C-sensor cell 202 ($\Delta VT2_{EXPOSED}$) is equal to 5 mV, then the C-sensor cell pair 201-202 does not correspond with an actually influenced C-sensor cell pair, because these post-exposure threshold voltage differences do not correspond with the expected post-exposure threshold voltage difference of 1 mV.

In accordance with one embodiment, the number of actually influenced C-sensor cell pairs is used to determine the dosage of the low dose exposure. That is, each actually influenced C-sensor cell pair corresponds with a single received alpha particle/gamma photon. The locations of the actually influenced C-sensor cell pairs within array 101 (as indicated by the row/column addresses of the actually influenced C-sensor cell pairs) can also be used to define the spatial distribution of the received low dose radiation. The area affected by a single alpha particle/gamma photon can also be estimated in response to the number of adjacent actually influenced C-sensor cell pairs.

Note that the 1/f noise performance is critical for the low dosage operation of radiation sensor 100. Noises below the official Spice values for the employed technology are achieved by keeping the readout transistors in strong accumulation or inversion regimes and chopping to bring them into the read-out mode. After exposure to low doses of radiation, large charges will remain stored in the floating gates of the C-sensor cells of array 101. Under these conditions, the $SiO_2$ interface traps of the C-sensor cells are continuously filled (or empty), and thus, 1/f noise is suppressed. That is, the readout transistors of the C-sensor cells are placed in a strong accumulation regime (or a strong inversion regime). Advantageously, the method described above does not require cycling pulses to shift the C-sensor cells into accumulation/inversion. Note that for large radiation doses (described in more detail below), the readout signals are large and 1/f noise is not critical.

In accordance with one embodiment, the above-described low dose measurement method is used to determine the dosage of the received radiation as long as the number of actually influenced C-sensor cell pairs is less than a predetermined percentage (e.g., 50%) of the total number of C-sensor cell pairs in sensor 100. Other percentages can be used in other embodiments.

If the number of actually influenced C-sensor cell pairs is greater than half the total number of C-sensor cell pairs, then the average threshold voltage shift ($\Delta VT_{AVG}$) can be used to calculate the high dose exposure. In one embodiment, the pre-exposure threshold voltage difference ($\Delta VT1_{INIT}$) between C-sensor cell 201 and C-reference cell 211 is compared with the post-exposure threshold voltage difference ($\Delta VT1_{EXPOSED}$) between C-sensor cell 201 and C-reference cell 211 to determine a threshold voltage shift (i.e., $\Delta VT1_{INIT} - \Delta VT1_{EXPOSED} = \Delta VT1_{SHIFT}$). The threshold voltage shift for all C-Sensor cells and their corresponding C-reference cells are determined in the same manner, and the average threshold voltage shift $\Delta VT_{AVG}$ is calculated (i.e., average $\Delta VT_{AVG} = \Sigma \Delta V_{T\_SHIFT}$ of all C-sensor cells/Number of C-sensor cells). The absorbed radiation is then determined in response to the average threshold voltage shift $\Delta VT_{AVG}$. Note that under high dose exposure, the threshold voltage shift due to natural retention loss and temperature effects will generally represent an insignificant portion of the average threshold voltage shift $\Delta VT_{AVG}$.

Reducing the specific (normalized to area) capacitance of the C-sensor cell will increase the change of voltage on the control gate for a given absorbed charge. It is therefore desirable to reduce the capacitance of the pixel sensing volume of the C-sensor cells of array 101 to a sufficiently low value, such that impingement of a single particle will result in a measurable threshold voltage change (e.g., about 1 mV).

Accordingly, the present invention also includes several embodiments of C-sensor cells having a reduced floating gate capacitance in the pixel sensing region. These embodiments are described in more detail below.

Figure 3:
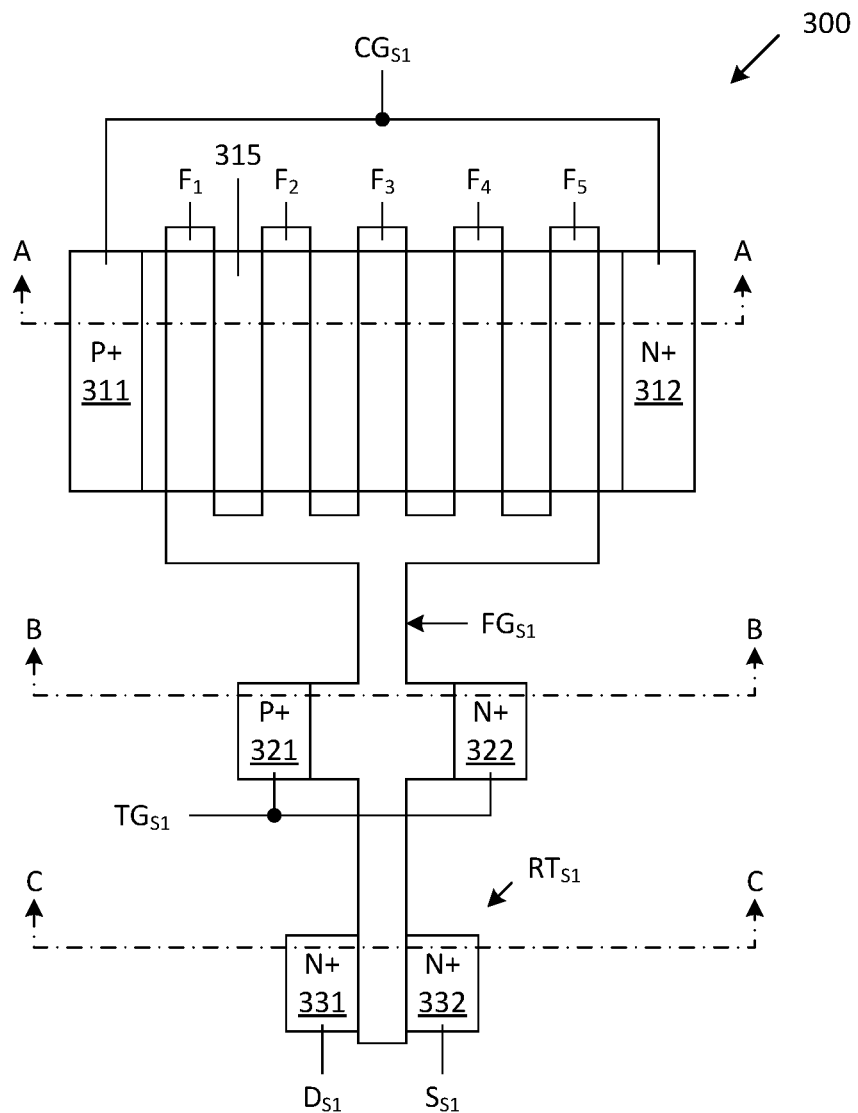
FIG. 3 is a top view of a C-sensor cell in accordance with one embodiment of the present invention.
Figure 4A:
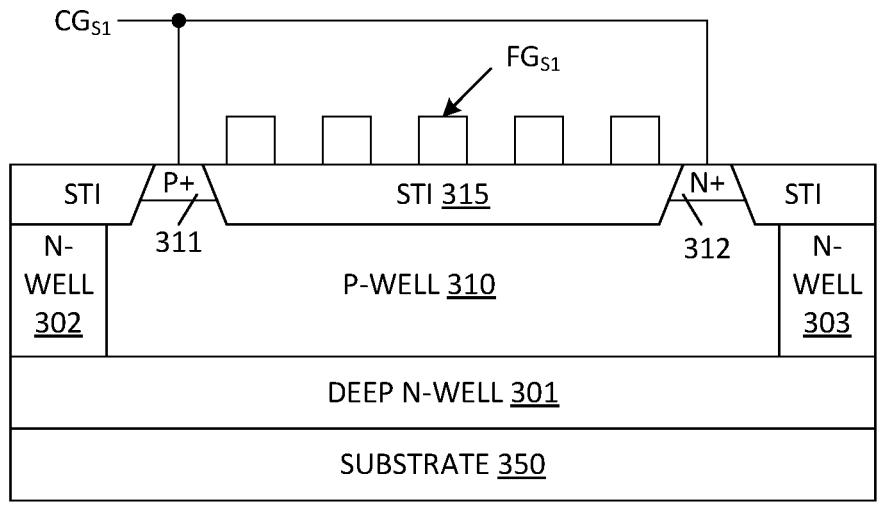
FIGS. 4A, 4B and 4C are cross sectional views of the C-sensor cell of FIG. 3, along section lines A-A, B-B and C-C of FIG. 3, in accordance with one embodiment of the present invention.
Figure 4B:
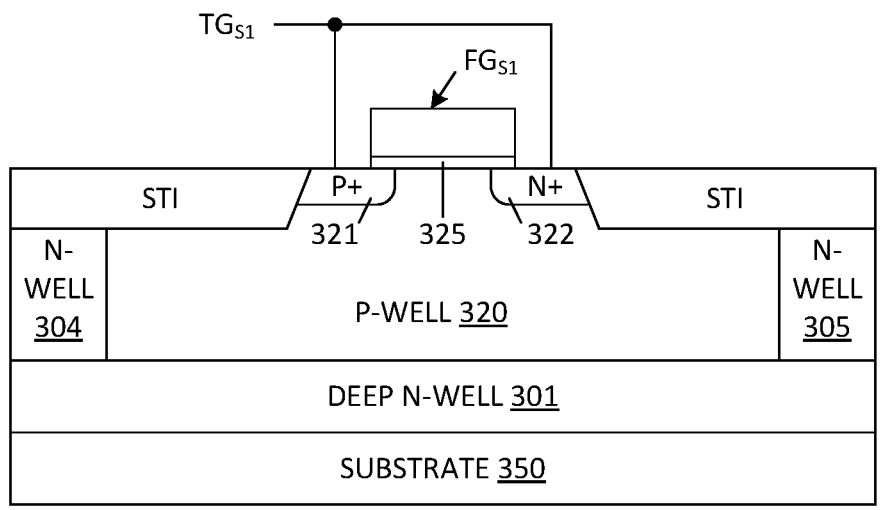
Figure 4C:
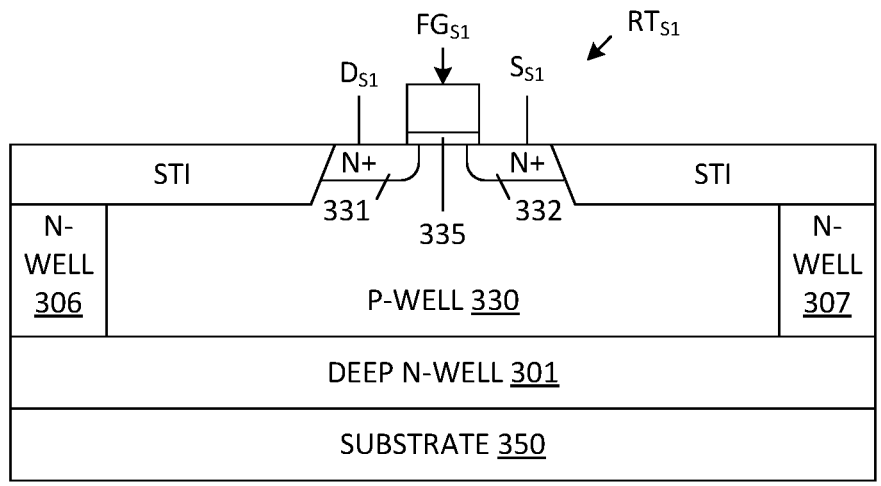

FIG. 3 is a top view of C-sensor cell 300 in accordance with one embodiment of the present invention. FIGS. 4A, 4B and 4C are cross sectional views of the C-sensor cell 300 along section lines A-A, B-B and C-C of FIG. 3. In this embodiment, C-sensor cell 300 includes substrate 350, deep n-well region 301, n-well regions 302-307, p-well regions 310, 320 and 330, shallow trench isolation (STI) region 315, P+ contact regions 311 and 321, N+ contact regions 312 and 322, thin gate dielectric regions 325 and 335, N-type drain region 331 ($D_{S1}$) and N-type source region 332 ($S_{S1}$), as illustrated. The P-well region 310 forms the control gate $CG_{S1}$, wherein connections to the control gate $CG_{S1}$ are provided via P+ region 311 and N+ region 312. Similarly, the p-well region 320 forms the tunnel gate $TG_{S1}$, wherein connections to the tunnel gate $TG_{S1}$ are provided via P+ region 321 and N+ region 322. The floating gate $FG_{S1}$ extends over P-well regions 310, 320 and 330, wherein the floating gate $FG_{S1}$ is separated from the P-well region 310 (i.e., control gate $CG_{S1}$) by a relatively thick STI region 315 having a thickness of about 3500 Angstroms, the floating gate $FG_{S1}$ is separated from the P-well region 320 (i.e., tunnel gate $TG_{S1}$) by a relatively thin gate dielectric region 325 having a thickness of about 100 Angstroms, and the floating gate $FG_{S1}$ is separated from the P-well region 330 (i.e., channel region of the read transistor $RT_{S1}$) by a relatively thin gate dielectric region 335 having a thickness of about 100 Angstroms.

The portion of the floating gate $FG_{S1}$ that extends over the p-well region 310 (i.e., control gate $CG_{S1}$) includes a plurality of parallel rectangular fingers $F_1$-$F_5$, which reduces the overlap area of the floating gate $FG_{S1}$ over the control gate $CG_{S1}$, thereby advantageously reducing the capacitance between the floating gate $FG_{S1}$ and the control gate $CG_{S1}$ (when compared with a conventional rectangular floating gate structure that extends entirely over the p-well region 310). This low capacitance in the pixel sensing region advantageously enables the threshold voltage of the read transistor $RT_{S1}$ to be more sensitive to changes in the charge stored by the floating gate $FG_{S1}$. In one embodiment, the C-sensor cell 300 of FIGS. 3 and 4A-4C enables the threshold voltage of the read transistor $RT_{S1}$ to change by 1 mV in response to the absorption of a single alpha particle/gamma photon in the STI region 315 (i.e., the pixel sensing volume of the radiation sensitive capacitance region).

Figure 5A:
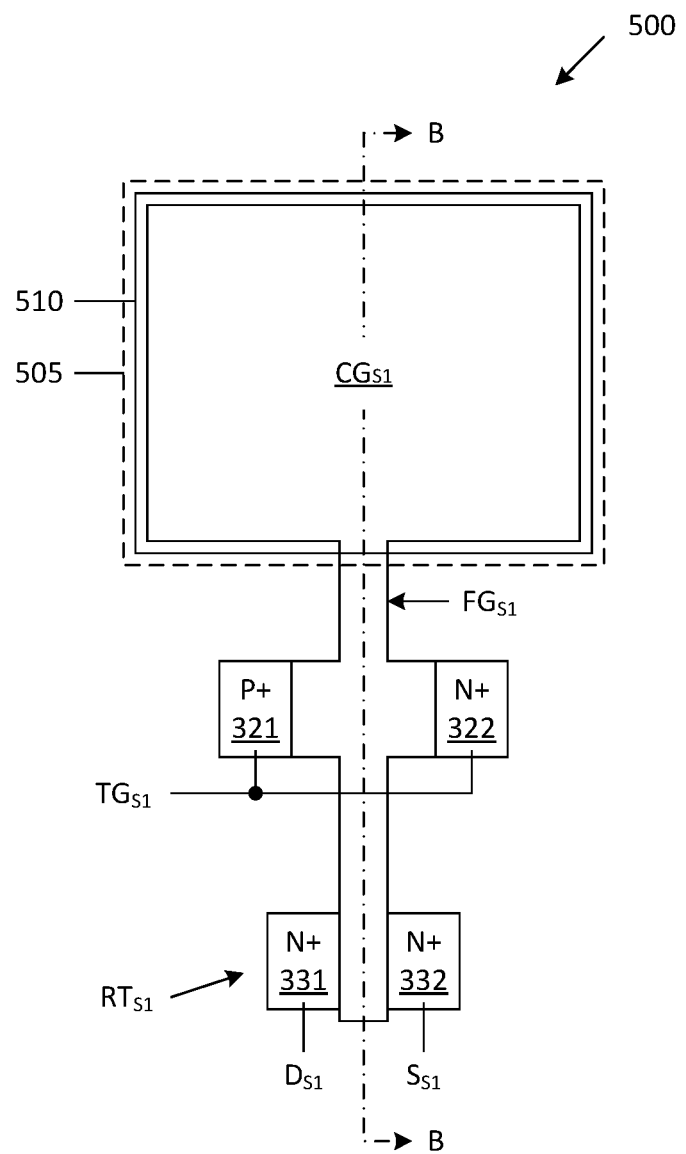
FIG. 5A is a top view of a C-sensor cell in accordance with an alternate embodiment of the present invention.
Figure 5B:
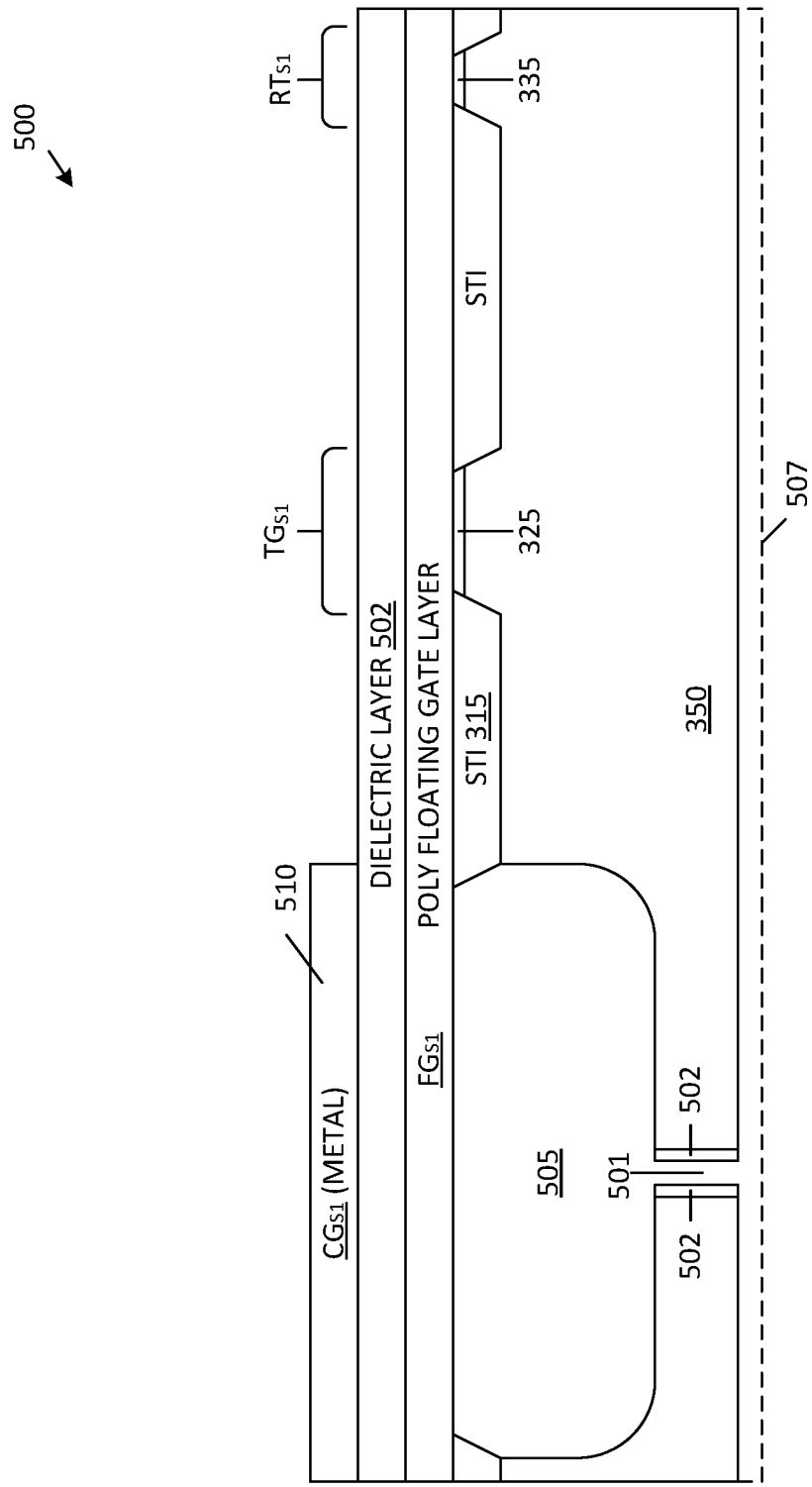
FIG. 5B is a cross-sectional view of the C-sensor cell of FIG. 5A, along section line B-B of FIG. 5A, in accordance with one embodiment of the present invention.

FIG. 5A is a top view of a C-sensor cell 500 in accordance with an alternate embodiment of the present invention. FIG. 5B is a cross-sectional view of C-sensor cell 500 along section line B-B of FIG. 5A. Because C-sensor cell 500 is similar to C-sensor cell 300, similar elements in FIGS. 3, 4A-4C and 5A-5B are labeled with similar reference numbers. As illustrated by FIGS. 5A and 5B, the control gate $CG_{S1}$ of C-sensor 500 is implemented by a metal structure 510, which is formed on a dielectric layer 502 over the floating polysilicon gate $FG_{S1}$. Although the portion of the floating gate $FG_{S1}$ located under the metal control gate $CG_{S1}$ has a solid rectangular shape in the illustrated embodiment, it is understood that this portion of the floating gate $FG_{S1}$ can be modified to include a plurality of parallel fingers (e.g., similar to fingers F1-F5) in other embodiments. In another embodiment, the metal control gate $CG_{S1}$ can be implemented by a plurality of parallel fingers, or a mesh structure. These alternate embodiments may be used to reduce the capacitance between the control gate $CG_{S1}$ and the underlying floating gate $FG_{S1}$.

To further reduce the capacitance associated with the control gate $CG_{S1}$/floating gate $FG_{S1}$ structure, a series of etches are performed to create a cavity (i.e., air gap) 505 under the control gate $CG_{S1}$ and floating gate $FG_{S1}$. Cavity 505 can be formed in accordance with various processing techniques, including those described in commonly owned, co-pending U.S. patent application Ser. No. 16/246,550 to Sirkis et al., titled "Semiconductor Device Having a Radio Frequency Circuit and a Method For Manufacturing the Semiconductor Device", filed Jan. 14, 2019, which is hereby incorporated by reference in its entirety. In general, cavity 505 can be formed by etching from the front side or the back side of the wafer structure. For example, to etch cavity 505 from the back side of substrate 350, a mask (not shown) is formed over the back side surface of substrate, and etch is performed through an opening in this mask to form a hollow 501, wherein the hollow 501 is a hole having a high aspect ratio. In one embodiment, this etch is a reactive ion etch that implements a Bosch process. The sidewalls of the hollow 501 are coated with a polymer 502 in the process of Bosch etch. A series of etches are then performed through the hollow 501 (and polymer 502) to remove portions of substrate 350 and STI layer 315 to expose the lower surface of floating gate $FG_{S1}$ and create cavity 505. In one embodiment, the series of etches includes a reactive ion etch that changes the chemistry of the Bosch etch used to form hollow 501. Note that this series of etches does not remove the polymer 502, which functions as an etch stop (or the polysilicon floating gate $FG_{S1}$). The interior of cavity 505 is then passivated, and the hollow 501 is then sealed (e.g., by forming a passivation layer 507 over the back side surface of substrate 301). Note that a similar process can be used to form cavity 505 from the front side of the wafer structure. The air gap/ionization chamber formed by cavity 505 effectively reduces the capacitance associated with the portion of the floating gate $FG_{S1}$ located under the metal control gate $CG_{S1}$. Note that this ionization chamber forms a pixel sensing volume.

Figure 6:
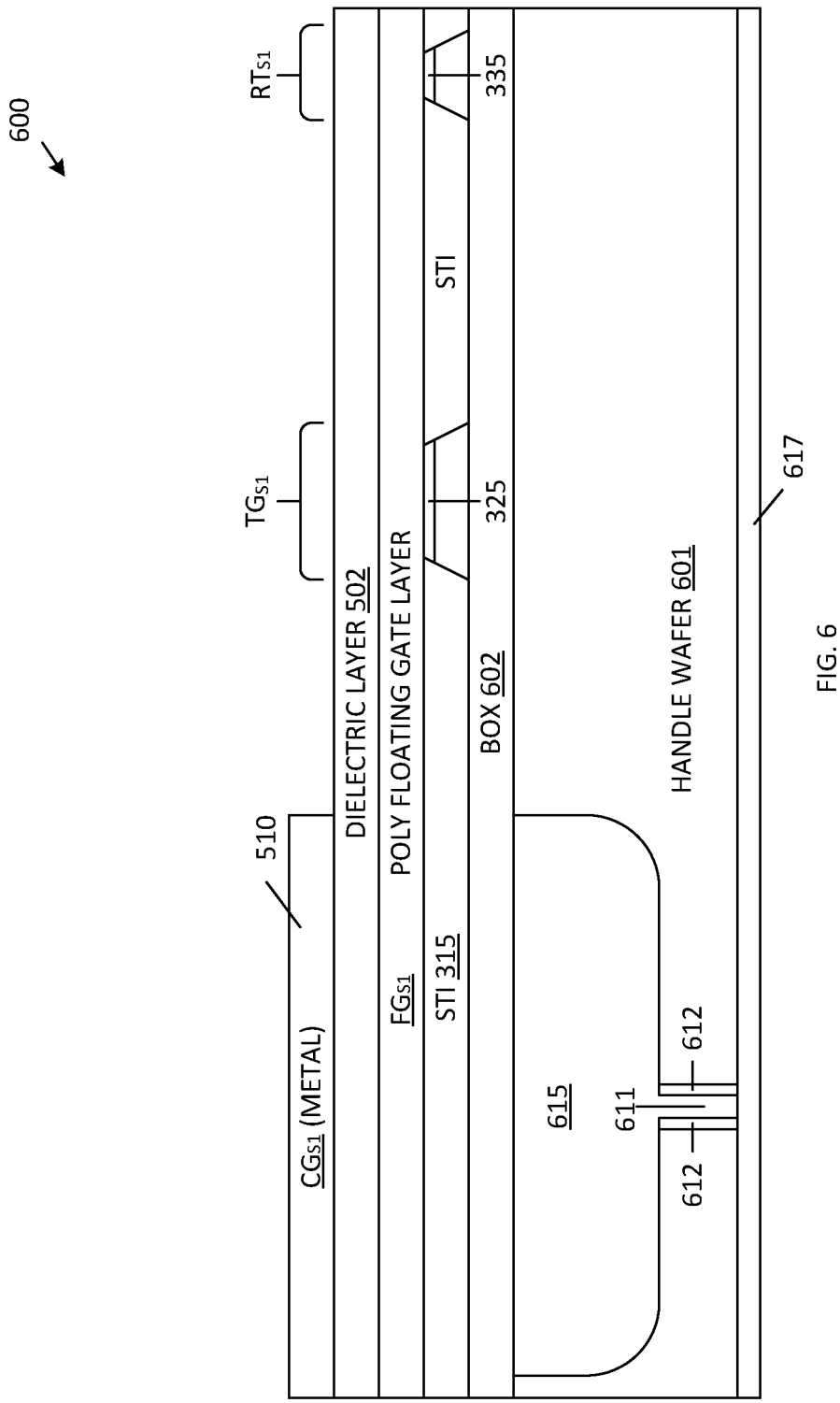
FIG. 6 is a cross-sectional view of a C-sensor cell in accordance with another embodiment of the present invention.

FIG. 6 is a cross-sectional view of a C-sensor cell 600 in accordance with another embodiment of the present invention. Because C-sensor cell 600 is similar to C-sensor cell 500, similar elements in FIGS. 5A-5B and 6 are labeled with similar reference numbers. C-sensor cell 600 has a silicon-on-insulator (SOI) structure, wherein STI region 315 is formed on a buried oxide layer 602, which in turn, is located on a handle wafer 601. In this embodiment, the tunnel gate structure $TG_{S1}$ and read transistor $RT_{S1}$ are formed in silicon islands (such that the deep n-well 301 and n-well regions 302-307 of FIGS. 4A-4C are not required). Cavity 615 is formed through the handle wafer 601, and extends to the buried oxide layer 602 under the control gate $CG_{S1}$, as illustrated. Cavity 615 is formed through hollow 611 and polymer (etch stop) lining 612 in the manner described above in connection with FIG. 5B. Hollow 611 is sealed by passivation layer 617, such that cavity 615 forms an air gap/ionization chamber that reduces the capacitance of the control gate $CG_{S1}$/floating gate $FG_{S1}$ structure.

Figure 7A:
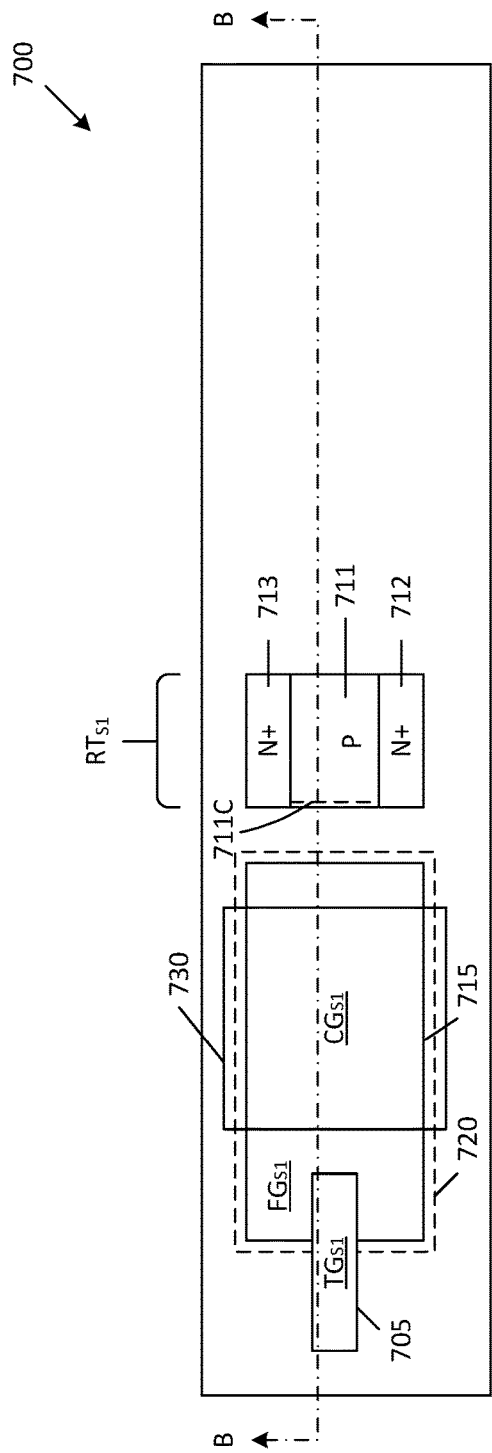
FIG. 7A is a top view of a C-sensor cell in accordance with an alternate embodiment of the present invention.
Figure 7B:
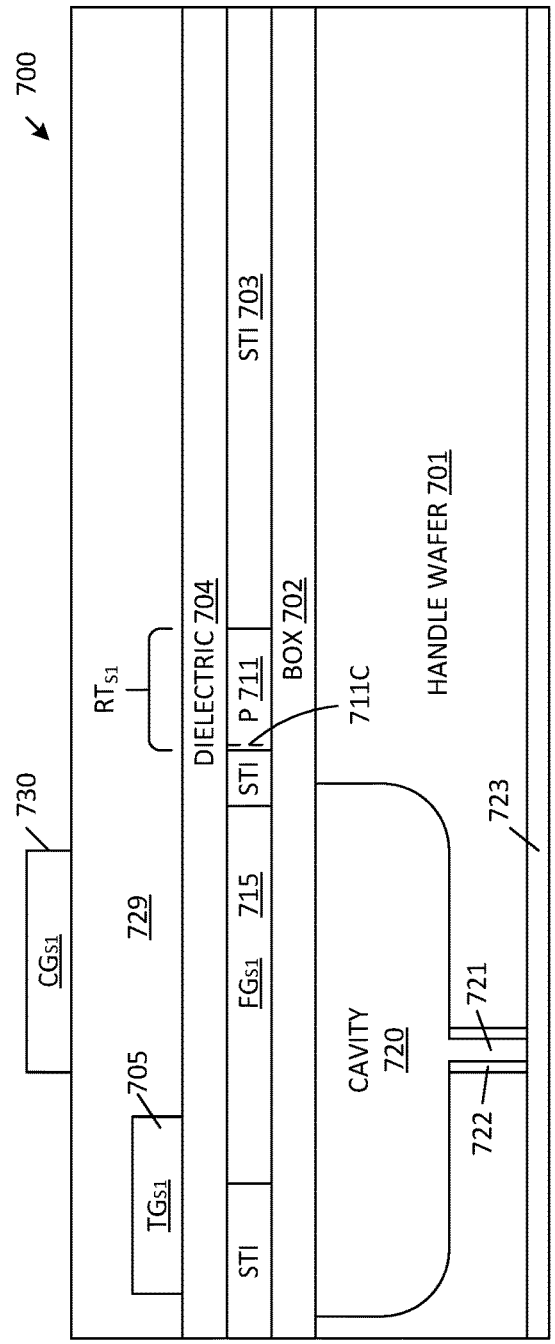
FIG. 7B is a cross-sectional view of the C-sensor cell of FIG. 7A, along section line B-B of FIG. 7A, in accordance with one embodiment of the present invention.

FIG. 7A is a top view of a C-sensor cell 700 in accordance with an alternate embodiment of the present invention. FIG. 7B is a cross-sectional view of C-sensor cell 700 along section line B-B of FIG. 7A. C-sensor cell 700 has a SOI structure, wherein STI region 703 is formed on a buried oxide layer 702, which in turn, is located on a handle wafer 701. The read transistor $RT_{S1}$, which is formed in first silicon island, includes p-type body region 711 and n-type source/drain regions 712-713. Floating gate $FG_{S1}$ is formed in a second silicon island, which includes p-type region 715. Floating gate $FG_{S1}$ is laterally separated from the p-type body region 711 by a portion of STI region 703. The edge 711C of p-type body region 711 adjacent to the floating gate $FG_{S1}$ forms a channel region of the read transistor $RT_{S1}$. The amount of charge stored by floating gate $FG_{S1}$ influences the channel region 711C (and thereby the read current) of read transistor $RT_{S1}$. A dielectric layer 704 is formed over the floating gate $FG_{S1}$, the read transistor $RT_{S1}$ and the STI region 703, as illustrated. A polysilicon structure 705 is formed over the dielectric layer 704 (and over the floating gate $FG_{S1}$), wherein the polysilicon structure 705 forms the tunneling gate $TG_{S1}$. A dielectric structure 729 is formed over the polysilicon structure 705, and a metal structure 730 is formed over the dielectric structure 729 (and over the floating gate $FG_{S1}$), wherein the metal structure 730 forms the control gate $CG_{S1}$. The floating gate $FG_{S1}$ can be programmed/erased, by applying voltages to the tunneling gate $TG_{S1}$ and control gate $CG_{S1}$.

C-sensor cell 700 also includes a cavity 720, which extends through the handle wafer 701 to the BOX layer 702 under the floating gate $FG_{S1}$. Cavity 720 is formed in the same manner described above for cavity 615 (i.e., forming hollow 721 and polymer (etch stop) coating 722, etching cavity 720 through hollow 721, and sealing hollow 721 with passivation layer 723). The resulting air gap advantageously reduces the capacitance of the control gate $CG_{S1}$/floating gate $FG_{S1}$ structure.

Figure 8:
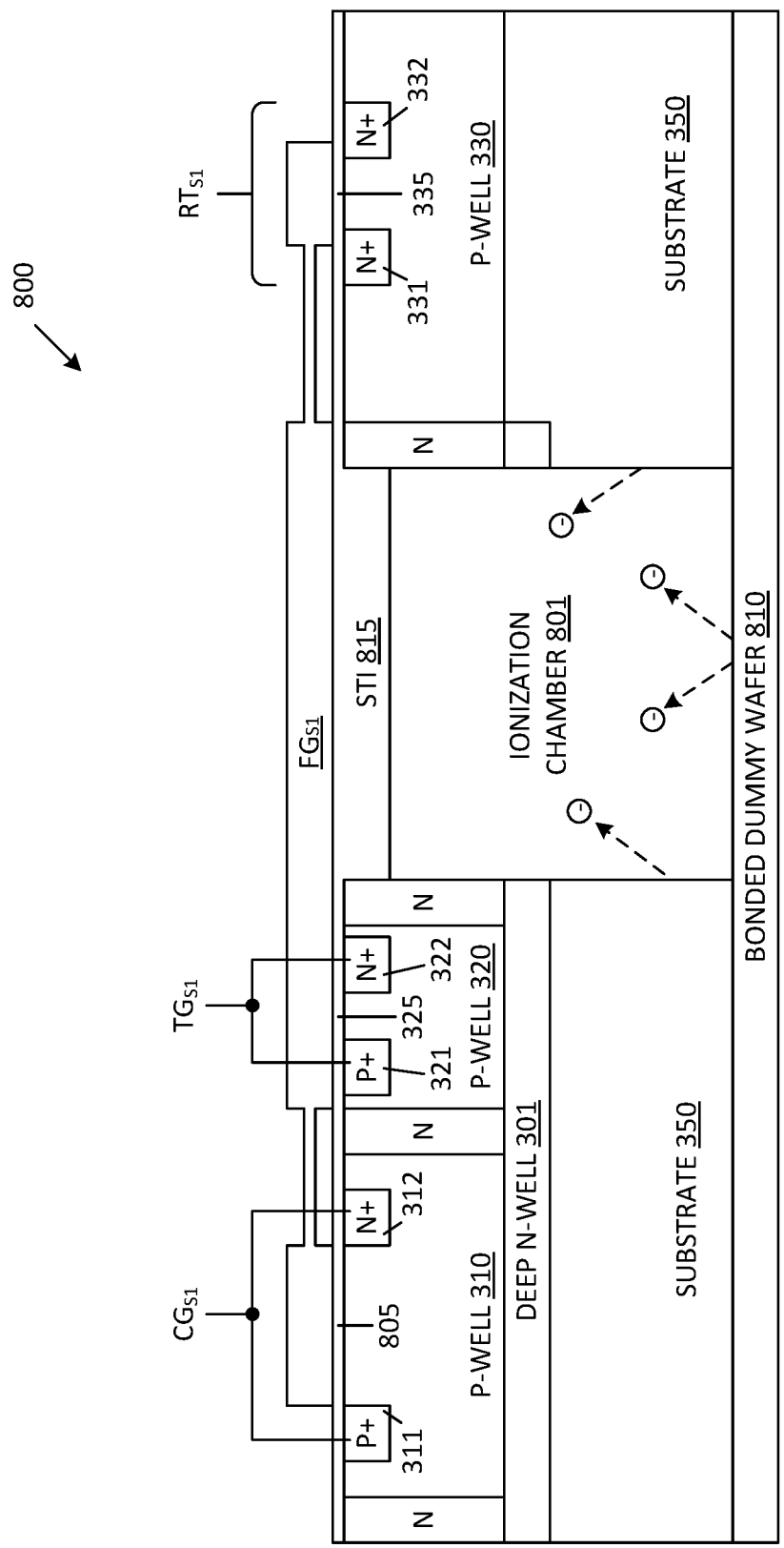
FIG. 8 is a cross-sectional view of a C-sensor cell in accordance with another embodiment of the present invention.

FIG. 8 is a cross-sectional view of a C-sensor cell 800 in accordance with another embodiment of the present invention. Because C-sensor cell 800 is similar to the C-sensor cell 300, similar elements in FIGS. 3, 4A-4C and 8 are labeled with similar reference numbers. Thus, C-sensor cell 800 includes substrate 350, deep n-well 301, p-well regions 310, 320 and 330, P-type regions 311 and 321, n-type regions 312, 322 and 331-332, and gate dielectric regions 325 and 335. In C-sensor cell 800, the floating gate $FG_{S1}$ is separated from the P-well region 310 by gate dielectric region 805, which has the same thickness as gate dielectric regions 325 and 335 (e.g., 100 Angstroms). STI region 815, which has a relatively large thickness in the range of about 3500 Angstroms, is located over ionization chamber 801. In one embodiment, ionization chamber 801 is formed by performing a backside etch through substrate 350 to STI region 815, and then bonding a dummy wafer 810 to the backside of substrate 350. Electrons are excited from the walls of ionization chamber 801 by gamma photons and optionally produce ionization of the air in chamber 801. The created charges reduce the charge stored by floating gate $FG_{S1}$. Dummy wafer 810 may be thin enough to allow the passage of alpha particles, or alpha particles may be detected from the front side of C-sensor cell 800.

Figure 9:
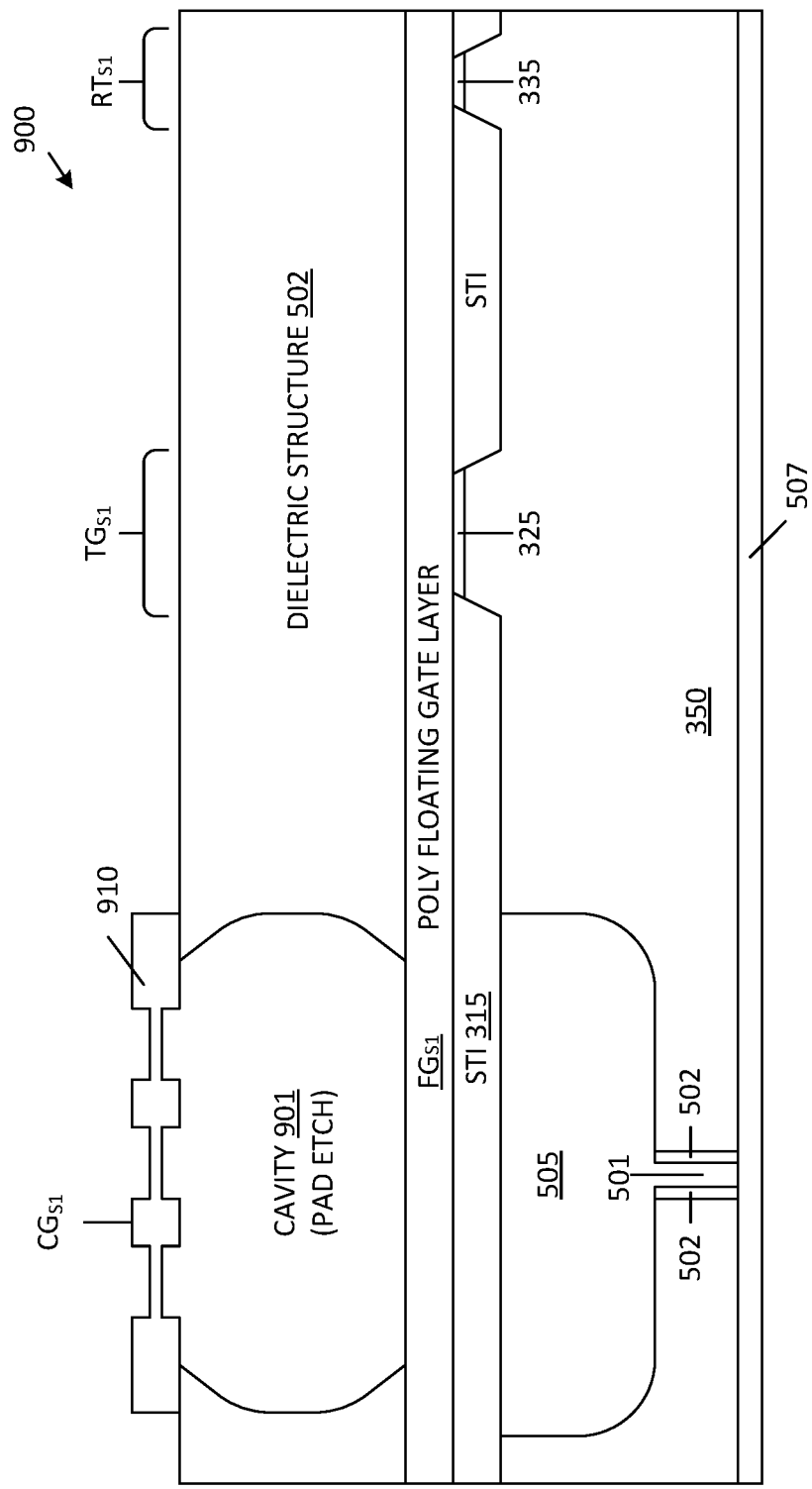
FIG. 9 is a cross-sectional view of a C-sensor cell in accordance with another embodiment of the present invention.

FIG. 9 is a cross-sectional view of a C-sensor cell 900 in accordance with another embodiment of the present invention. Because C-sensor cell 900 is similar to the C-sensor cell 500 of FIGS. 5A-5B, similar elements in FIGS. 5A-5B and 9 are labeled with similar reference numbers. Note that in C-sensor cell 900, the cavity 505 described above in connection with FIG. 5B is stopped on the STI region 315 (rather than extending through STI region 315). Also in C-sensor cell 900, a cavity 901 is formed from the front side of the wafer structure, through the dielectric structure 502 (which may include several dielectric layers). In one embodiment, cavity 901 is formed at the stage of pad etch. Cavity 901 exposes the portion of the floating gate $FG_{S1}$ located over cavity 505. A metal grill (or mesh) 910 is formed over cavity 901, thereby forming control gate $CG_{S1}$. Cavities 505 and 901 advantageously reduce the capacitance of the control gate $CG_{S1}$/floating gate $FG_{S1}$ structure. The capacitance lowering effect is increased because material is removed from both sides of the floating gate $FG_{S1}$.

Figure 10A:
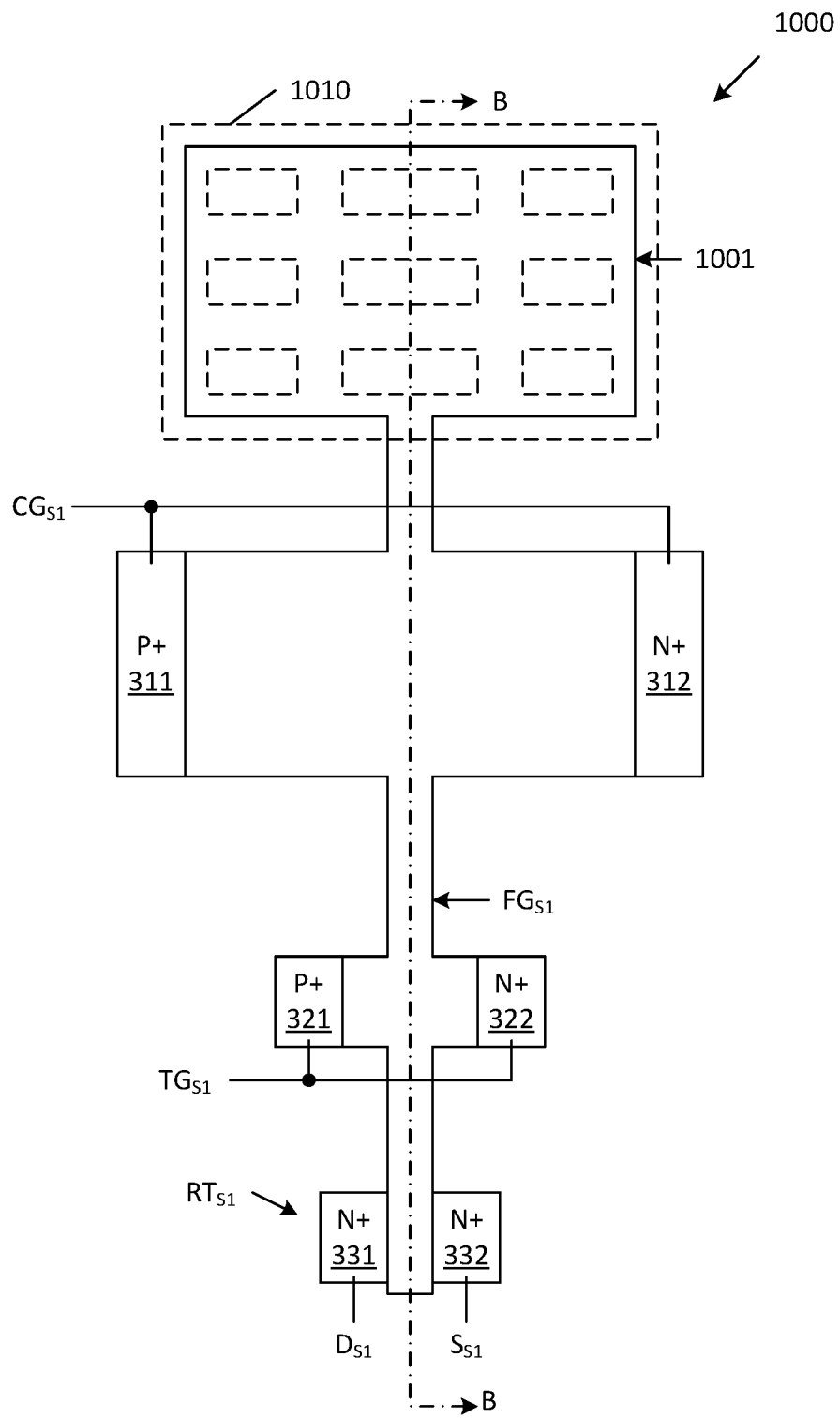
FIG. 10A is a top view of a C-sensor cell in accordance with another embodiment of the present invention.
Figure 10B:
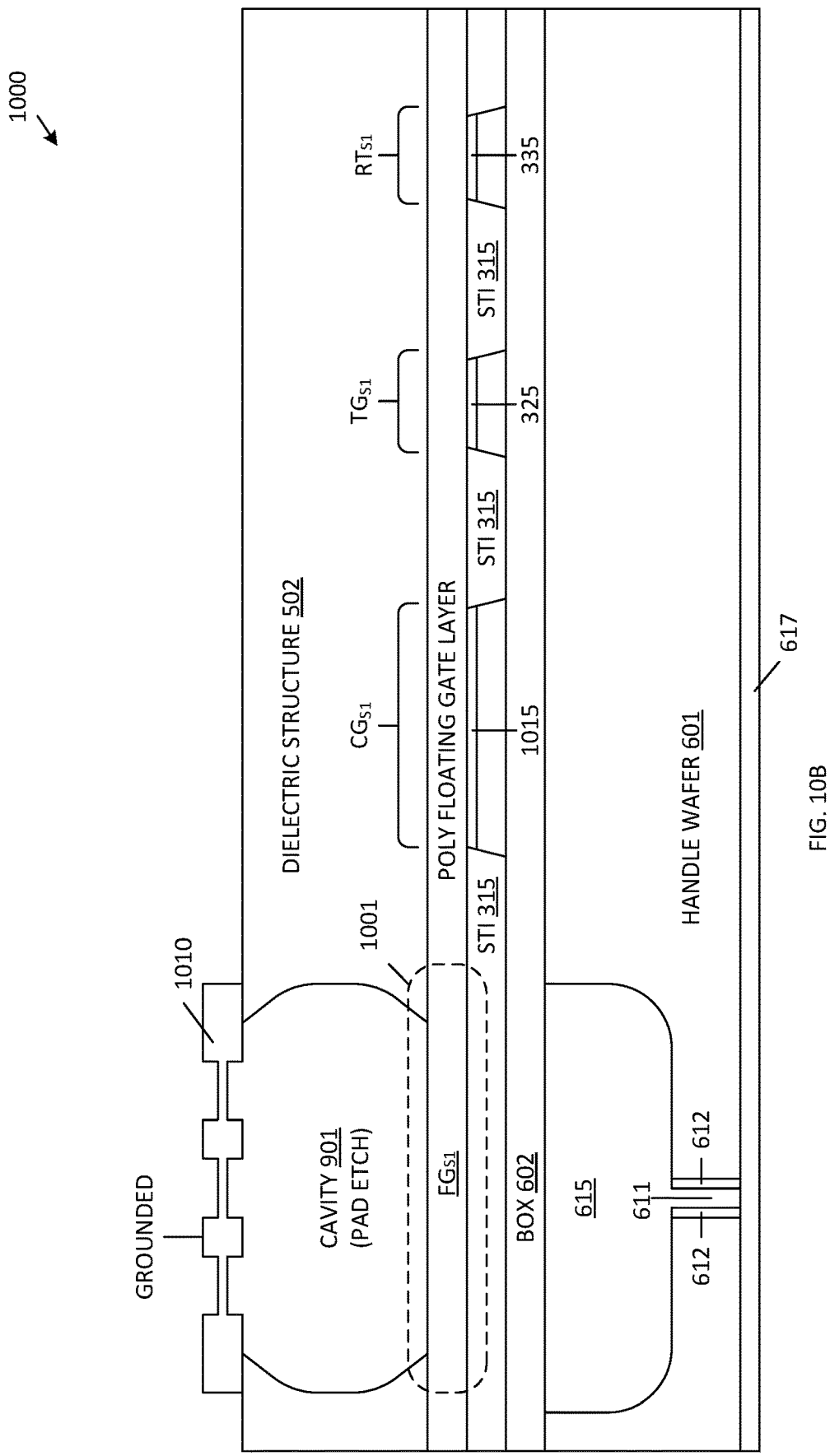
FIG. 10B is a cross-sectional view of the C-sensor cell of FIG. 10A, along section line B-B of FIG. 10A, in accordance with one embodiment of the present invention.

FIG. 10A is a top view of a C-sensor cell 1000 in accordance with another alternate embodiment of the present invention. FIG. 10B is a cross-sectional view of C-sensor cell 1000 along section line B-B of FIG. 10A. Because C-sensor cell 1000 includes elements similar to those found in C-sensor cells 300, 600 and 900, similar elements in FIGS. 3, 4A-4C, 6, 9 and 10A-10B are labeled with similar reference numbers. As illustrated by FIG. 10A, C-sensor cell 1000 includes many of the same elements described above in connection with FIG. 3. Note however, that the polysilicon floating gate $FG_{S1}$ of C-sensor cell 1000 extends past the control gate $CG_{S1}$ to an extension region 1001.

As illustrated by FIG. 10B, a thin gate dielectric region 1015 (rather than the STI region 315) is located between the floating gate $FG_{S1}$ and the underlying control gate region. Note that the control gate region $CG_{S1}$, the tunnel gate region $TG_{S1}$ and the read transistor $RT_{S1}$ are formed in corresponding silicon islands, which are located on buried oxide layer 602, and surrounded by STI region 315.

Over the floating gate extension region 1001, a cavity 901 is formed through the dielectric structure 502 to expose a portion of the floating gate extension region. A metal grid (or mesh) 1010 is located over the cavity 901 (in the same manner that metal grid 910 is located over cavity 901 in C-sensor cell 900). Metal grid 1010 is grounded. In this embodiment, there is a separate isolated control gate $CG_{S1}$.

Also, under the floating gate extension region 1001, an air gap/ionization chamber 615 is formed through handle wafer 601 to buried oxide layer 602 (wherein cavity 615 is formed through hollow 611 and sidewall etch stop layer 612, and capped by passivation layer 617 in the manner described above in connection with FIG. 6). During exposure to radiation, charges generated by alpha particles/gamma photons may approach STI 315 within extension region 1001 via ionization chamber 615 or floating gate $FG_{S1}$ via cavity 901. The capacitance of the associated pixel sensing volume is low because the removal of material from both sides of the floating gate extension region 1001.

The low capacitances of the pixel sensing volumes of C-sensor cells 300, 500, 600, 700, 800, 900 and 1000 advantageously enable the use of these C-sensor cells in the sensor array 101 of radiation sensor 100 in accordance with various embodiments of the present invention.

Absorption of the same doses of radiation having different energy may have different impact on solid state devices. This means that the same dose of radiation, but from particles with different energies, will result in different threshold voltage (Vt) shifts in the C-sensor cells of array 101. This may result in a mistake in estimating the absorbed dose of radiation. In accordance with one embodiment, this obstacle is overcome by using two (or more) different types of C-sensor cells, wherein at least one of these types of C-sensor cells includes a radiation filter (shield). Simultaneous exposure of two different C-sensor cells (one with a filter and one without a filter) will lead to different responses (i.e., different changes in threshold voltages), because some portion of the radiation is absorbed in the filter. Because the absorption of different radiation energies is different in filter materials, the difference in response of shielded and non-shielded sensors may be used to define both the energy and dose of absorbed radiation. In the prior art, shielding is implemented by using different packages or covering materials. In accordance with one embodiment of the present invention, C-sensor cells are shielded using materials which are a part of the standard CMOS process, such as aluminum, copper, tungsten and dielectric material.

Figure 11:
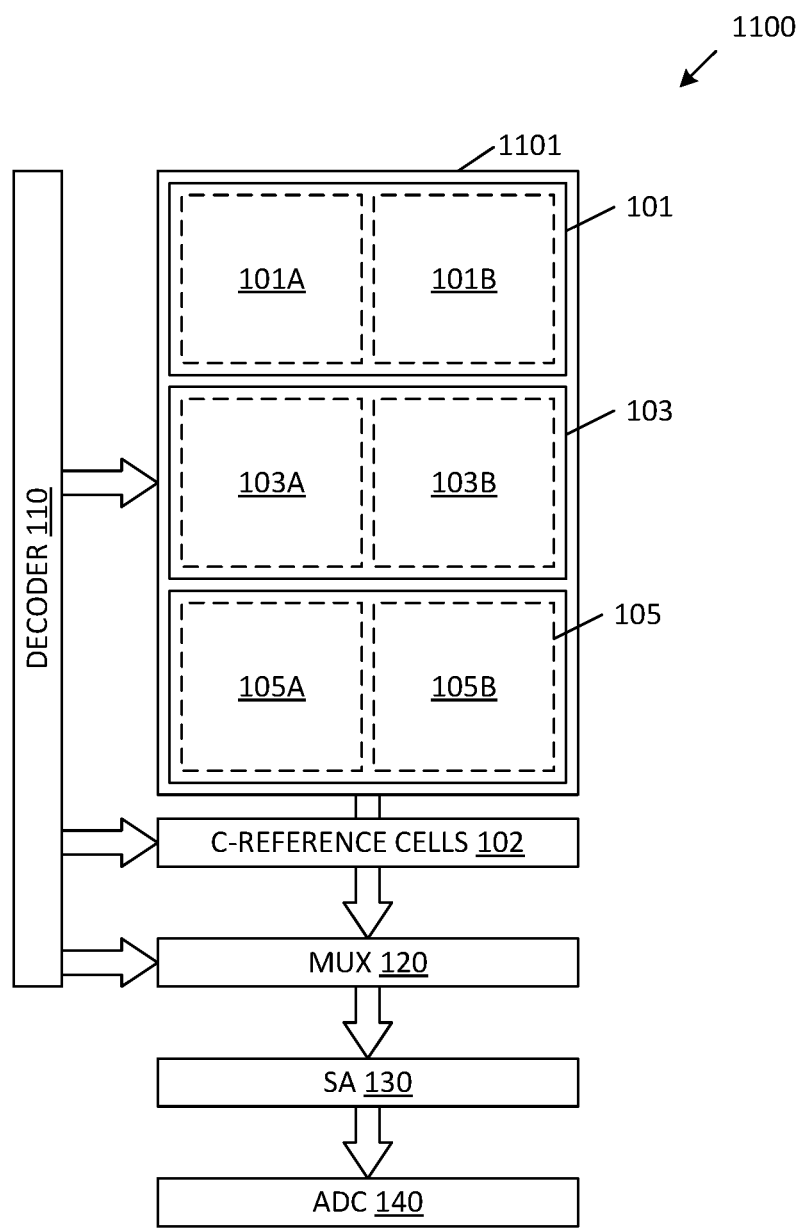
FIG. 11 is a block diagram of a radiation sensor that includes an array of unshielded C-sensor cells and an array of shielded C-sensor cells, in accordance with another embodiment of the present invention.

FIG. 11 is a block diagram of a radiation sensor 1100 that includes an array 1101 of C-sensor cells, which includes the array 101 of C-sensor cells described above (which includes identical sub-arrays 101A and 101B). In addition, the C-sensor cell array 1101 of FIG. 11 also includes a second array 103 of C-sensor cells (which includes identical sub-arrays 103A and 103B), and a third array 105 of C-sensor cells (which includes identical sub-arrays 105A and 105B). In general, C-sensor cell arrays 103 and 105 operate in the same manner described above in connection with C-sensor cell array 101. However, the C-sensor cells of arrays 103 and 105 include different radiation filtering structures than the C-sensor cells or array 101, in the manner described in more detail below.

Figure 12A:
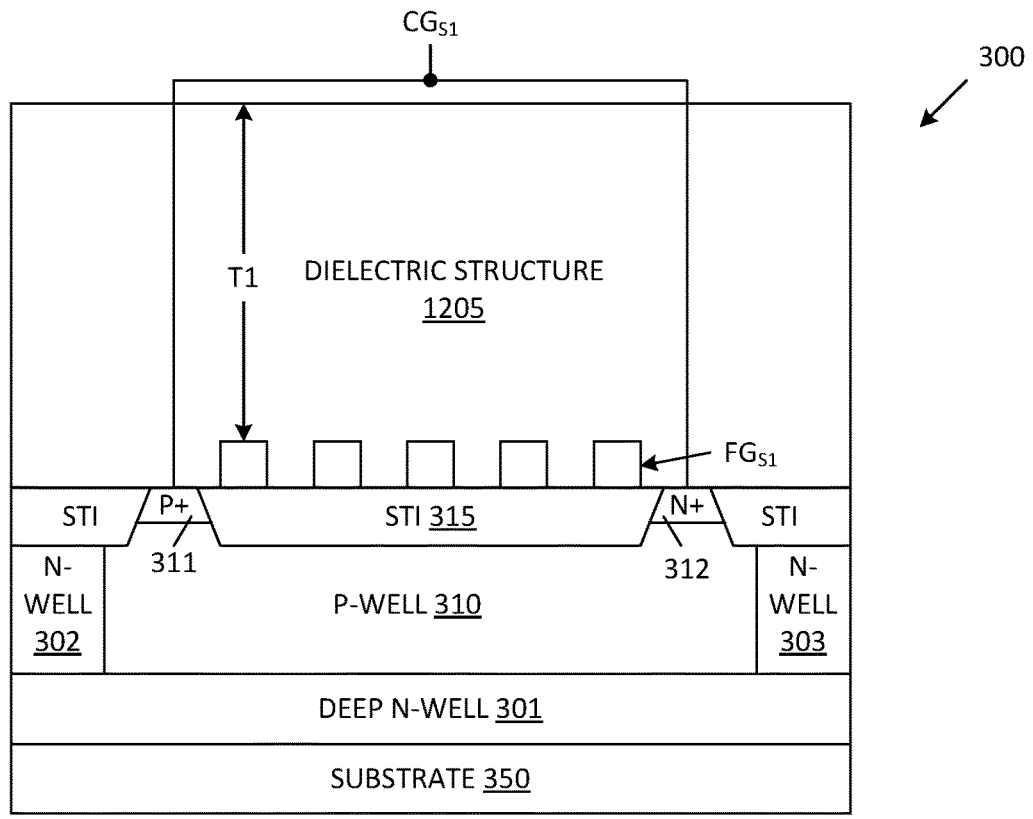
FIG. 12A is a cross sectional view of a radiation sensing region of an unshielded C-sensor cell, which includes a dielectric structure having a thickness of T1 over a floating gate, in accordance with one embodiment of the present invention.

FIG. 12A is a cross sectional view of the unshielded C-sensor cell 300 of FIGS. 3 and 4A, which includes a dielectric structure 1205 having a thickness of T1 over the floating gate $FG_{S1}$. Dielectric structure 1205 includes the various dielectric layers deposited during the formation of the multi-layer interconnect structure (note that the metal layers of this multi-layer interconnect structure are not included in dielectric structure 1205). As described above, C-sensor cell 300 is included in C-sensor cell array 101.

Figure 12B:
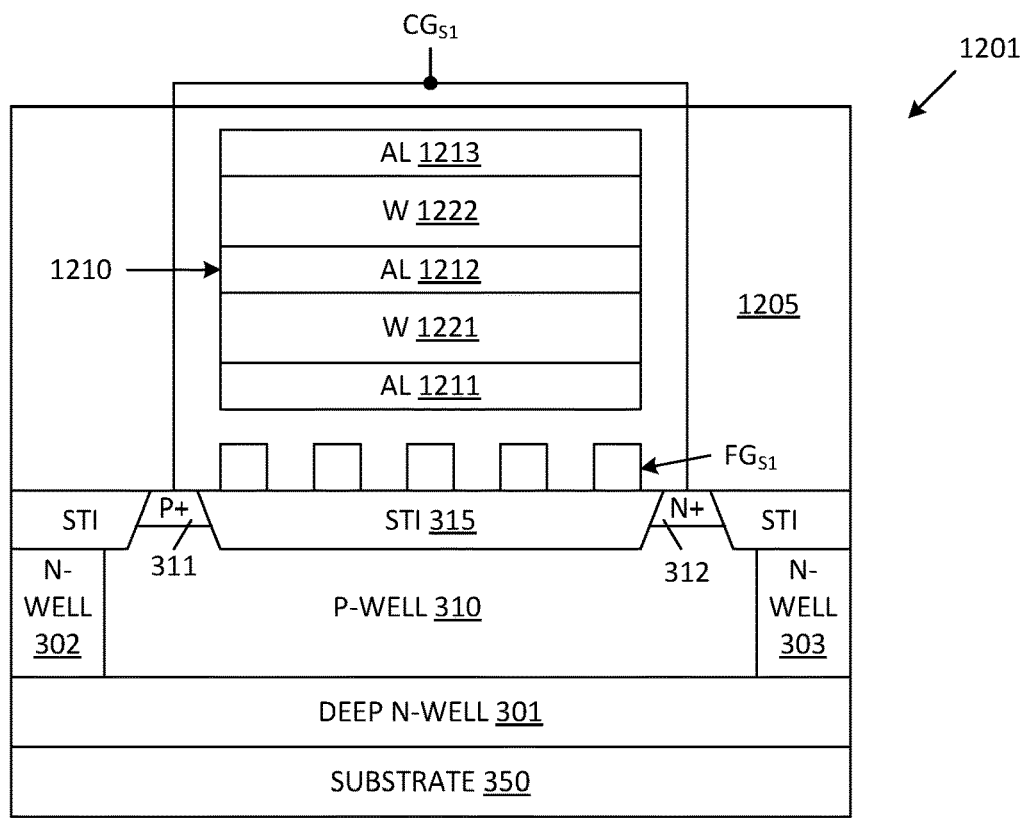
FIG. 12B is a cross-sectional view of a radiation sensing region of a shielded C-sensor cell in accordance with one embodiment of the present invention.

FIG. 12B is a cross-sectional view of a shielded C-sensor cell 1201 (along the same section line as FIG. 12A) in accordance with one embodiment of the present invention. Similar elements in FIGS. 12A and 12B are labeled with similar reference numbers. Notably, shielded C-sensor cell 1201 includes a radiation filter (shield) 1210 over the radiation sensitive capacitance structure associated with the floating gate $FG_{S1}$, wherein the filter 1210 includes aluminum layers 1211-1213 and tungsten layers 1221-1222, which are layered as illustrated. In accordance with one embodiment, aluminum layers 1211-1213 are formed at the same time as metal layers M1-M3 of the multi-layer interconnect structure, and tungsten layers 1221 and 1222 are formed at the same time as the inter-metal contacts between metal layers M1-M2 and M2-M3. As a result, no additional process steps are required to form filter 1210. Although filter 1210 includes three aluminum layers 1211-1213 and two tungsten layers 1221-1222, it is understood that other numbers of layers can be used in other embodiments to adjust the radiation absorbing properties of the filter 1210. It is also understood that in other embodiments, filter 1210 can be implemented using other materials commonly available in a CMOS process (e.g., copper).

Figure 12C:
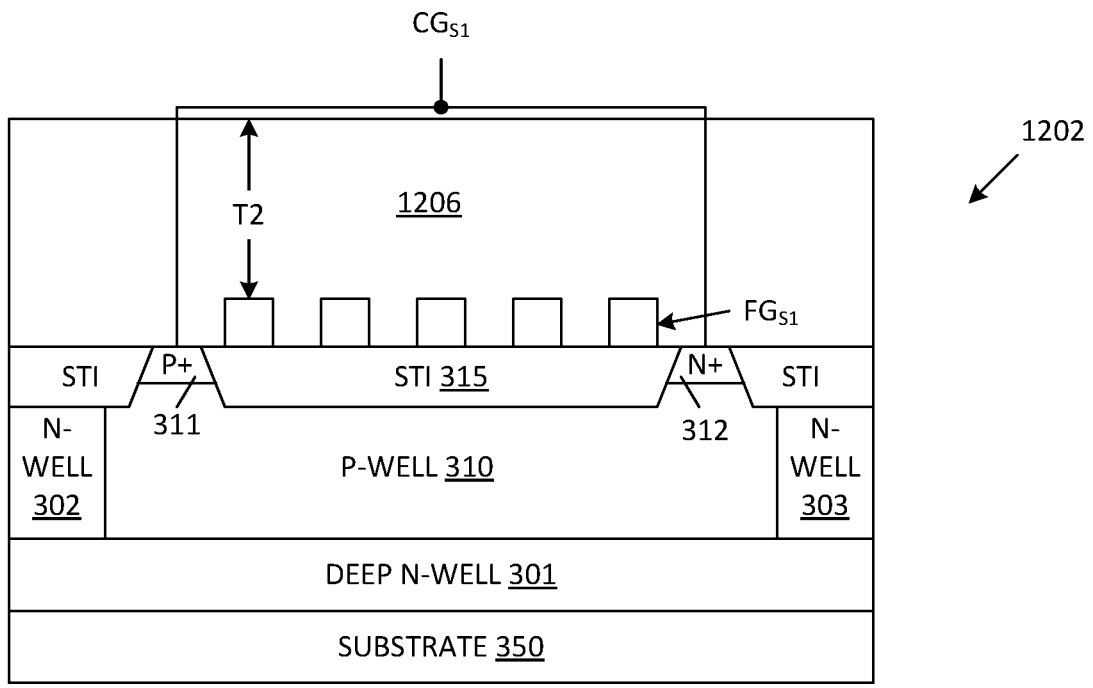
FIG. 12C is a cross sectional view of a radiation sensing region of an unshielded C-sensor cell, which includes a dielectric structure having a thickness of T2 over a floating gate, in accordance with one embodiment of the present invention.
Figure 12D:
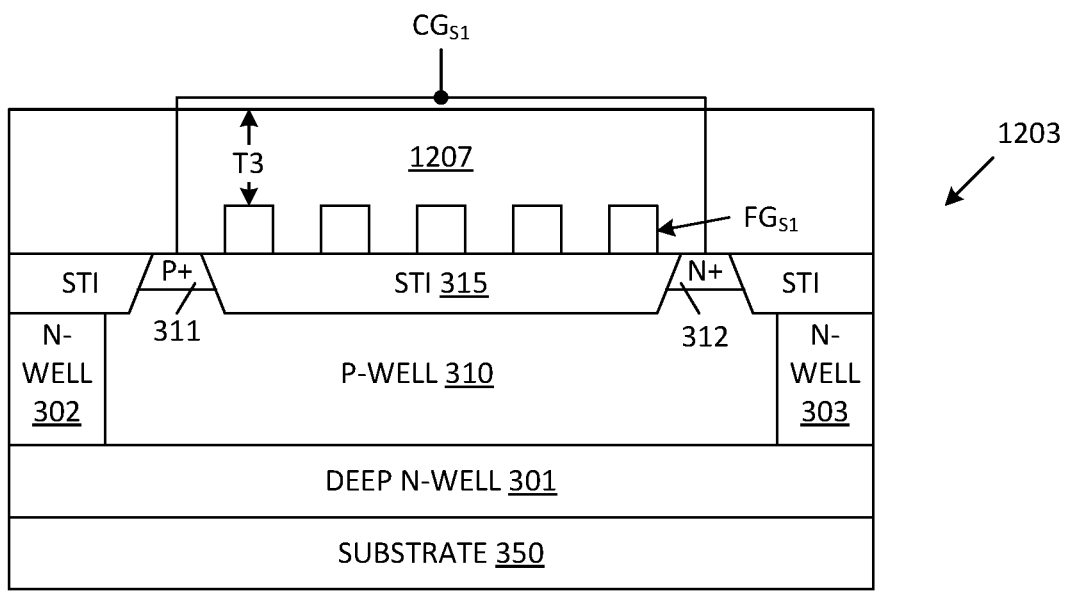
FIG. 12D is a cross sectional view of a radiation sensing region of an unshielded C-sensor cell, which includes a dielectric structure having a thickness of T3 over a floating gate, in accordance with one embodiment of the present invention.

FIGS. 12C and 12D are cross sectional views of C-sensor cells 1202 and 1203 respectively (along the same section line as FIG. 12A) in accordance with other embodiments of the present invention. Similar elements in FIGS. 12A, 12C and 12D are labeled with similar reference numbers. Notably, C-sensor cell 1202 includes a dielectric structure 1206 having a thickness of T2 over floating gate $FG_{S1}$, wherein the thickness T2 is less than the thickness T1 of dielectric structure 1205. Similarly, C-sensor cell 1203 includes a dielectric structure 1207 having a thickness of T3 over floating gate $FG_{S1}$, wherein the thickness T3 is less than the thickness T2 of dielectric structure 1206. In accordance with one embodiment, dielectric structures 1206 and 1207 can be fabricated by eliminating one or more dielectric layers of the multi-layer interconnect structure in the area over floating gate $FG_{S1}$. As a result, no additional processing steps are required to implement dielectric structures 1205-1207. Assuming that dielectric structures 1205, 1206 and 1207 are constructed of the same material(s) (e.g., silicon oxide), C-sensor cells 201, 1202 and 1203 will advantageously exhibit different sensitivity to radiation having different energies (effectively providing a shielding/filter function).

In accordance with various embodiments of the present invention, the C-sensor cells 1201, 1202 and 1203 (and the above-described variations thereof) can be used to implement the C-sensor cells included in sensor arrays 103 and 105 within sensor 1100 (FIG. 11). For example, C-sensor array 103 can be implemented using C-sensor cell 1201, and C-sensor array 105 can be implemented using C-sensor cell 1202 (or 1203). In another example, C-sensor array 103 can be implemented using C-sensor cell 1201, and C-sensor array 105 can be implemented using a modified version of C-sensor cell 1201, which includes different metal layers than C-sensor cell 1201 in the manner described above. In another example, C-sensor array 103 can be implemented using C-sensor cell 1202, and C-sensor array 105 can be implemented using C-sensor cell 1203. While the C-sensor cell array 1101 of FIG. 11 includes three C-sensor cell arrays 101, 103 and 105, it is understood that in other embodiments, C-sensor cell array 1101 can be modified to include only two C-sensor cells arrays (e.g., C-sensor cell arrays 101 and 103), or more than three C-sensor cell arrays.

Providing C-sensor cell arrays 101, 103, 105 having different radiation filters advantageously allows radiation sensor 1100 to effectively measure radiation having different energies.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. A radiation sensor comprising:
   a first array of sensor cells;
   a second array of sensor cells, wherein each of the sensor cells in the first array and each of the sensor cells in the second array includes a radiation sensitive capacitance structure and a read transistor coupled to a corresponding floating gate, and wherein each of the sensor cells in the first array is logically paired with a corresponding one of the sensor cells in the second array, wherein the logically paired sensor cells are spatially separated by a distance exceeding a correlation length of radiation being sensed by the radiation sensor; and
   a multiplexer circuit that selectively couples read transistors of logically paired sensor cells of the first and second arrays in differential pairs to compare the threshold voltages of the read transistors.

2. The radiation sensor of claim 1, wherein the first array is identical to the second array.

3. The radiation sensor of claim 1, wherein different logically paired sensor cells of the first and second arrays are separated by different distances.

4. The radiation sensor of claim 1, further comprising a plurality of constant current sources, wherein the each of the differential pairs is coupled to a corresponding one of the constant current sources to compare the threshold voltages of the read transistors.

5. The radiation sensor of claim 4, further comprising a plurality of sense amplifiers, wherein each of the differential pairs is coupled to a corresponding one of the sense amplifiers.

6. The radiation sensor of claim 1, wherein the radiation sensitive capacitance structure of each of the sensor cells includes a plurality of polysilicon fingers of the corresponding floating gate.

7. The radiation sensor of claim 1, wherein each of the sensor cells includes an air gap located adjacent to the radiation sensitive capacitance structure.

8. The radiation sensor of claim 7, wherein each air gap is formed in a substrate upon which the sensor cells are fabricated.

9. The radiation sensor of claim 8, wherein the air gap is sealed by a layer coupled to the substrate.

10. The radiation sensor of claim 9, wherein the layer is a passivation layer formed on the substrate.

11. The radiation sensor of claim 9, wherein the layer comprises a wafer bonded to the substrate.

12. The radiation sensor of claim 9, further comprising:
    a multi-layer interconnect structure that includes a plurality of metal layers and a plurality of dielectric layers; and
    radiation filters located over the radiation sensitive capacitance structures of the sensor cells of the first and second arrays of sensor cells, wherein the radiation filters are formed using the multi-layer interconnect structure.

13. The radiation sensor of claim 12, wherein the radiation filters include one or more of the plurality of metal layers.

14. The radiation sensor of claim 13, wherein the radiation filters comprise aluminum, copper or tungsten.

15. The radiation sensor of claim 12, wherein the radiation filters include one or more of the plurality of dielectric layers.

16. The radiation sensor of claim 8, wherein each air gap is formed in a multi-layer dielectric structure located over the corresponding floating gate of the sensor cell.

17. The radiation sensor of claim 1, further comprising a plurality of radiation insensitive reference cells, wherein the multiplexer circuit is further configured to selectively couple read transistors of the sensor cells to the radiation insensitive reference cells in differential pairs to measure threshold voltages of the read transistors of the sensor cells.

18. The radiation sensor of claim 17, wherein each of the radiation insensitive reference cells is identical to each of the sensor cells, wherein the sensor cells are programmed, and the radiation insensitive reference cells are not programmed.

19. The radiation sensor of claim 17, wherein each of the radiation insensitive reference cells has a control gate electrically connected to a floating gate.

20. The radiation sensor of claim 17, wherein each of the radiation insensitive reference cells comprises a CMOS flash cell.

* * * * *